(12) United States Patent
Matsushita et al.

(10) Patent No.: US 6,720,096 B1
(45) Date of Patent: Apr. 13, 2004

(54) DIELECTRIC ELEMENT

(75) Inventors: Shigeharu Matsushita, Katano (JP); Mitsuaki Harada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/711,512

(22) Filed: Nov. 14, 2000

(30) Foreign Application Priority Data

| Nov. 17, 1999 | (JP) | ............ P11-326544 |
| Sep. 20, 2000 | (JP) | ............ 2000-284892 |
| Sep. 20, 2000 | (JP) | ............ 2000-285667 |

(51) Int. Cl.$^7$ ............................................. B32B 9/00
(52) U.S. Cl. ................... 428/701; 428/699; 428/704
(58) Field of Search .................. 428/446, 689, 428/697, 698, 699, 701, 702

(56) References Cited

U.S. PATENT DOCUMENTS

| 5,111,355 A | | 5/1992 | Anand et al. ............... 361/313 |
| 5,122,923 A | * | 6/1992 | Matsubara et al. ........ 361/321.5 |
| 5,504,041 A | | 4/1996 | Summerfelt ................ 437/235 |
| 5,822,175 A | | 10/1998 | Azuma |
| 5,843,830 A | | 12/1998 | Graettinger et al. |
| 5,998,258 A | * | 12/1999 | Melnick et al. ............. 438/253 |
| 6,004,839 A | | 12/1999 | Hayashi et al. |
| 6,090,657 A | | 7/2000 | Yamoto et al. ............. 438/240 |
| 6,177,351 B1 | | 1/2001 | Beratan et al. ............. 438/694 |
| 6,178,082 B1 | | 1/2001 | Farooq et al. |
| 6,180,971 B1 | | 1/2001 | Maejima |
| 6,225,656 B1 | | 5/2001 | Cuchiaro et al. |
| 6,235,603 B1 | | 5/2001 | Melnick et al. |
| 6,320,213 B1 | * | 11/2001 | Kirlin et al. ................ 257/295 |
| 6,329,680 B1 | | 12/2001 | Yoshida et al. |
| 6,358,794 B1 | | 3/2002 | Oh ............................. 438/253 |
| 6,437,391 B1 | | 8/2002 | Oh ............................. 257/306 |
| 2001/0021544 A1 | | 9/2001 | Ohnuma et al. |
| 2001/0046789 A1 | | 11/2001 | Taguwa |
| 2002/0021544 A1 | | 2/2002 | Cho et al. |
| 2002/0047172 A1 | | 4/2002 | Reid ........................... 257/415 |

FOREIGN PATENT DOCUMENTS

| EP | 0886317 A2 | 12/1998 |
| JP | 2-183569 | 7/1990 |
| JP | 08-191137 | 7/1996 |
| JP | 08-335681 | 12/1996 |
| JP | 8-340091 | 12/1996 |
| JP | 9-252094 | 9/1997 |

(List continued on next page.)

OTHER PUBLICATIONS

Extended Abstracts of the 1999 International Conference on Solid State Devices and Materials, Tokyo, 1999, pp. 388–389 (No month).

Sigeharu Matsushita et al.; "IrSiN films with superior oxgen–diffusion barrier effect for stacked ferroelectric capacitors"; Applied Physics Letters; vol. 77, No. 20; Nov. 13, 2000; pp. 3200–3202.

*Primary Examiner*—Deborah Jones
*Assistant Examiner*—Arden Sperty
(74) *Attorney, Agent, or Firm*—Westerman, Hattori, Daniels & Adrian, LLP

(57) ABSTRACT

A dielectric element employing an oxide-based dielectric film capable of suppressing oxidation of an electrode or deterioration of film characteristics of the oxide-based dielectric film is obtained. This dielectric element comprises an insulator film including the oxide-based dielectric film and the electrode including a first conductor film containing at least a metal and silicon. The aforementioned metal includes at least one metal selected from a group consisting of Ir, Pt, Ru, Re, Ni, Co and Mo. Thus, the aforementioned first conductor film serves as a barrier film for stopping diffusion of oxygen. In heat treatment for sintering the oxide-based dielectric film, therefore, oxygen is effectively inhibited from diffusing along grain boundaries of the electrode. Consequently, a conductive material located under the electrode can be inhibited from oxidation.

16 Claims, 17 Drawing Sheets

FOREIGN PATENT DOCUMENTS

| | | |
|---|---|---|
| JP | 9-289291 | 11/1997 |
| JP | 10-056144 | 2/1998 |
| JP | 10-056145 | 2/1998 |
| JP | 10-93043 | 4/1998 |
| JP | 11-68057 | 3/1999 |
| JP | 11-074488 | 3/1999 |
| JP | 11-307736 | 11/1999 |
| JP | 2000-4001 | 1/2000 |
| JP | 2000-124154 | 4/2000 |
| JP | 2000-150825 | 5/2000 |
| JP | 2000-040800 | 8/2000 |
| JP | 2000-269455 | 9/2000 |
| JP | 2000-340769 | 12/2000 |
| JP | 2001-257327 | 9/2001 |
| JP | 2001-274160 | 10/2001 |
| JP | 2002-134715 | 5/2002 |
| WO | WO 99/27579 | 6/1999 |

\* cited by examiner

DIELECTRIC ELEMENT

BACKGROUND OF THE INVENTION

1. Field of the Invention

The present invention relates to a dielectric element, and more specifically, it relates to a dielectric element such as a capacitor element employing an oxide-based dielectric film.

2. Description of the Prior Art

Deep study is recently made on a ferroelectric memory as a nonvolatile memory having a high speed and requiring low power consumption. FIGS. 29 and 30 are sectional views showing representative structures of conventional ferroelectric memories.

In the structure shown in FIG. 29, an isolation oxide film 101, a well region 103 for a MOS transistor 102, a source region 104, a source electrode 105 connected with the source region 104, a gate electrode 106, a drain region 107 and an interlayer isolation film 114 are formed on an Si substrate 100. An oxide-based dielectric capacitor 113 is connected to the drain region 107 through a plug 109.

In the structure shown in FIG. 30, an isolation oxide film 101, a well region 103 for a MOS transistor 102, a source region 104, a source electrode 105 connected with the source region 104, a gate electrode 106, a drain region 107, a drain electrode 108 connected with the drain region 107 and an interlayer isolation film 114 are formed on an Si substrate 100. An oxide-based dielectric capacitor 113 is connected to the gate electrode 106 through a plug 109. The structure shown in FIG. 30 is referred to as an FET-type ferroelectric memory.

In each of the structures shown in FIGS. 29 and 30, the oxide-based dielectric capacitor 113 is formed by a lower electrode 110, an oxide-based dielectric film 111 and an upper electrode 112. The lower electrode 110 is connected with the plug 109 made of polycrystalline silicon (poly-Si) or tungsten (W). The oxide-based dielectric film 111 of $PbZr_xTi_{1-x}O_3$ (PZT) or $SrBi_2Ta_2O_9$ (SBT) serving as a ferroelectric film is formed on the lower electrode 110. The upper electrode 112 is formed on the oxide-based dielectric film 111. In particular, iridium (Ir), platinum (Pt) or a material containing such a component is widely employed as the material for the lower electrode 110. This is because this material has low reactivity with the oxide-based dielectric film 111 or excellent high-temperature resistance. The upper electrode 112 is also made of a material such as iridium (Ir) or platinum (Pt), similarly to the lower electrode 110. In each of the structures shown in FIGS. 29 and 30, the upper electrode 112 is formed by an Ir film.

Also in a dynamic random access memory (DRAM), the capacitor size is recently reduced following refinement of cells and hence a capacitor structure employing an oxide-based dielectric film of $Ba_xSr_{1-x}TiO_3$ (BST) or the like having a high dielectric constant is required. The capacitor structure of this DRAM is similar to that shown in FIG. 29.

However, self orientation of Ir or Pt is so strong that crystal grains exhibit a columnar structure when annealed. In this case, grain boundaries align in a direction perpendicular to the substrate. In annealing performed in a high-temperature oxygen atmosphere for sintering the oxide-based dielectric film forming a capacitor insulator film, therefore, oxygen diffuses along the grain boundaries. Thus, poly-Si or W forming an electrode such as a plug is oxidized to form an oxide film. Consequently, the capacitor characteristics are deteriorated or bad influence is exerted on preparation of the capacitor element.

When the plug 109 is prepared from poly-Si and partially oxidized in the element structure shown in FIG. 29, for example, a silicon oxide film is formed between the lower electrode 110 and the plug 109. In this case, the silicon oxide film serves as a capacitor insulator film and is serially connected to the oxide-based dielectric capacitor 113. When capacitors are serially connected, a bias applied thereto is divided in inverse proportion to the capacitance of each capacitor. The dielectric constant of an oxide-based dielectric film is generally several 10 to several 100 times that of a silicon oxide film, and hence the capacitance of the oxide-based dielectric capacitor 113 is increased.

Therefore, a bias applied in the state serially connecting the oxide-based dielectric capacitor 113 with the silicon oxide capacitor is not much divided to the oxide-based dielectric capacitor 113. In the case of a ferroelectric memory having the oxide-based dielectric film 111 of a ferroelectric film, for example, its inverted polarization value is reduced to disadvantageously deteriorate the memory characteristics. In the case of a DRAM having the oxide-based dielectric film 111 of a high dielectric film, its charging quantity is reduced to disadvantageously deteriorate the memory characteristics.

When made of W in place of the aforementioned poly-Si in the element structure shown in FIG. 29, the plug 109 is partially oxidized to form a tungsten oxide film. In this case, film separation results from volume expansion caused by forming the tungsten oxide film, leading to such a problem that it is difficult to prepare a high-quality capacitor element.

In addition, oxygen diffuses outward from the oxide-based dielectric film 111 along the grain boundaries of Ir or Pt forming the lower electrode 110 or the upper electrode 112, to disadvantageously deteriorate the characteristics such as the polarization characteristic of the oxide-based dielectric film 111 itself.

In the element structure shown in FIG. 29, the Ir film forming the upper electrode 112 is inconveniently oxidized when the oxide-based dielectric film 111 is annealed in an oxygen atmosphere to be sintered. FIGS. 31 and 32 are schematic sectional views for illustrating problems of the prior art.

When the Ir film forming the upper electrode 112 is oxidized in the annealing performed in the oxygen atmosphere for sintering the oxide-based dielectric film 111 as hereinabove described, a gigantic hillock (projection) 112a is readily formed on the surface of the upper electrode 112, as shown in FIG. 31 or 32. When such a hillock 112a is formed, a plate line 116a is disadvantageously disconnected as shown in FIG. 31. Or, an upper wire 118 formed on a plate wire 116b through an interlayer isolation film 117 is disadvantageously short-circuited to the plate wire 116b, as shown in FIG. 32.

When oxidized, the Ir film forming the upper electrode 112 causes compositional change to inconveniently result in stress change of the Ir film. Therefore, the ferroelectric characteristics also disadvantageously tend to change.

SUMMARY OF THE INVENTION

An object of the present invention is to provide a dielectric element having excellent characteristics by suppressing oxidation of an electrode.

Another object of the present invention is to suppress deterioration of the characteristics of an oxide-based dielectric film in the aforementioned dielectric element.

Still another object of the present invention is to provide a dielectric element capable of inhibiting the surface of an upper electrode from formation of a hillock (projection) by suppressing oxidation of the upper electrode.

A further object of the present invention is to suppress stress change resulting from compositional change of an upper electrode material.

A dielectric element according to an aspect of the present invention comprises an insulator film including an oxide-based dielectric film and an electrode including a first conductor film containing at least a metal and silicon. The aforementioned metal includes at least one metal selected from a group consisting of Ir, Pt, Ru, Re, Ni, Co and Mo. According to the present invention, the dielectric element is a wide concept including not only a capacitor element but also another element employing a dielectric material.

In the dielectric element according to this aspect, the first conductor film serves as a barrier film for stopping diffusion of oxygen due to the aforementioned structure. Thus, oxygen can be effectively inhibited from diffusing along grain boundaries of the electrode in heat treatment for sintering the oxide-based dielectric film. Therefore, a conductive material located under the electrode can be inhibited from oxidation. Thus, deterioration of memory characteristics can be suppressed and film separation can be prevented in the case of a capacitor element, for example. Consequently, an element having excellent characteristics can be formed.

In the dielectric element according to the aforementioned aspect, the first conductor film preferably further contains nitrogen. Thus, the function of the first conductor film for stopping diffusion of oxygen can be further improved. The metal (M) forming the dielectric element according to the aforementioned aspect hardly forms a nitride in general, or is stabilized in a state of MxN (x≧2) when forming a nitride. When such a metal is bonded with silicon (Si) and nitrogen (N), the metal (M) is more readily bonded with Si than with N while N is readily bonded with Si. Therefore, the M—Si—N film conceivably has a structure obtained by embedding Si—N in metal silicide (M—Si). Thus, the M—Si—N film can conceivably have oxygen diffusion stoppability of the silicon nitride (Si—N) film and conductivity of the metal silicide (M—Si) at the same time. Consequently, the M—Si—N film can further improve the function of the first conductor film for stopping diffusion of oxygen.

In the aforementioned case, the metal forming the first conductor film is preferably iridium (Ir). When iridium is employed as the metal forming the first conductor film, the first conductor film can serve as the barrier film for stopping diffusion of oxygen. In this case, the first conductor film may be a conductor film containing iridium and silicon, or may be a conductor film containing iridium, silicon and nitrogen. The first conductor film may be formed by a multilayer structure of a conductor film containing iridium and silicon and a conductor film containing iridium, silicon and nitrogen. Thus, the conductor film containing iridium, silicon and nitrogen can keep high oxygen diffusion stoppability while the conductor film containing iridium and silicon can form a barrier film reduced in resistance.

In this case, the conductor film containing iridium, silicon and nitrogen is preferably arranged on the side of the oxide-based dielectric film. Thus, the first conductor film can more effectively stop diffusion of oxygen from the oxide-based dielectric film. Therefore, deterioration of the characteristics of the oxide-based dielectric film itself can be suppressed.

In the aforementioned case, the first conductor film is preferably arranged between a conductive material and the insulator film. Thus, the first conductor film can effectively inhibit oxygen from diffusing into the conductive material from the insulating material. In this case, the conductive material is preferably converted to an insulating material when oxidized, and the first conductor film and the insulator film are preferably successively formed on the conductive material. Thus, the first conductor film can effectively inhibit oxygen from diffusing into the conductive material from the insulating material, thereby suppressing oxidation of the conductive material. In this case, further, the conductive material preferably includes either a polycrystalline silicon plug or a tungsten plug. When employing a polycrystalline silicon plug or a tungsten plug as the conductive material, oxidation of the polycrystalline silicon plug or the tungsten plug is suppressed. Thus, a generally employed technique of forming a polycrystalline silicon or tungsten plug can be applied as such with no problem.

The dielectric element according to the aforementioned aspect preferably further comprises a conductive crystal film arranged between the first conductor film and the insulator film. Thus, the first conductor film can stop diffusion of oxygen while the conductive crystal film can form an insulator film consisting of an oxide-based dielectric film having excellent characteristics such as a polarization characteristic.

In this case, the conductive crystal film is preferably a metal film containing at least one metal selected from a group consisting of Pt, Ir, Ru and Re. Thus, the conductive crystal film consisting of the aforementioned metal film can form an insulator film consisting of an oxide-based dielectric film having excellent characteristics such as a polarization characteristic. In this case, the first conductor film preferably contains Pt, silicon and nitrogen, and the conductive crystal film is preferably a metal film consisting of Pt. Thus, the first conductor film containing Pt, silicon and nitrogen can more effectively stop diffusion of oxygen while the conductive crystal film consisting of the metal film of Pt can form an insulator film consisting of an oxide-based dielectric film having excellent characteristics such as a polarization characteristic.

In the aforementioned case, the conductive crystal film may be a metal oxide film containing at least one metal selected from a group consisting of Pt, Ir, Ru and Re. Thus, the conductive crystal film consisting of the aforementioned metal oxide film can form an insulator film consisting of an oxide-based dielectric film having excellent characteristics such as a polarization characteristic.

In the dielectric element according to the aforementioned aspect, the electrode including the first conductor film is preferably an upper electrode. When so formed as to include the first conductor film containing at least the metal and silicon having an excellent barrier property against oxygen diffusion, the upper electrode can be effectively inhibited from oxidation. Thus, the surface of the upper electrode can be inhibited from formation of a hillock (projection) resulting from oxidation of the upper electrode. Consequently, disconnection of wires or short-circuiting across the wires can be suppressed. Further, the material for the upper electrode can be inhibited from compositional change resulting from oxidation of the upper electrode. Thus, stress change of the upper electrode material can be suppressed, thereby suppressing change of the element characteristics. In this case, the first conductor film preferably further contains nitrogen. Thus, the function of the first conductor film for stopping diffusion of oxygen can be further improved.

In this case, further, the first conductor film preferably contains Ir, silicon and nitrogen. Thus, high oxygen diffusion stoppability can be implemented by employing the first conductor film containing Ir, silicon and nitrogen. Therefore, the first conductor film (upper electrode) can be effectively inhibited from oxidation.

In the aforementioned case, the upper electrode preferably includes a plurality of layers, and at least the uppermost layer of the upper electrode is preferably formed by the first conductor film. Thus, oxidation of the outermost surface of the upper electrode can be suppressed by forming at least the uppermost layer of the upper electrode by the first conductor film. In this case, the upper electrode is preferably formed by a multilayer structure of the first conductor film, containing Ir, silicon and nitrogen, forming the uppermost layer and a second conductor film containing Ir. Thus, it is possible to reduce the resistance of the upper electrode with the second conductor film containing Ir while suppressing oxidation of the upper electrode with the first conductor film containing Ir, silicon and nitrogen.

A dielectric element according to another aspect of the present invention comprises an insulator film including an oxide-based dielectric film and an upper electrode including a first conductor film containing TaN. According to this aspect, the upper electrode can be effectively inhibited from oxidation when so formed as to include the first conductor film containing TaN having an excellent barrier property against diffusion of oxygen. Thus, the surface of the upper electrode can be inhibited from formation of a hillock (projection) resulting from oxidation of the upper electrode. Consequently, disconnection of wires and short-circuiting across the wires can be suppressed. Further, compositional change of the upper electrode material resulting from oxidation of the upper electrode can be suppressed thereby suppressing stress change of the upper electrode material.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the accompanying drawings.

First Embodiment

Figure 1:
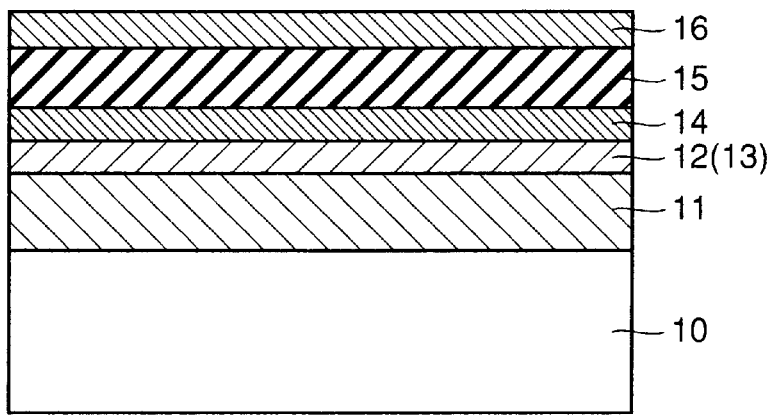
FIG. 1 is a sectional view showing the structure of a capacitor element according to a first embodiment of the present invention.

FIG. 1 is a sectional view showing the structure of a capacitor element according to a first embodiment of the present invention. Referring to FIG. 1, the capacitor element according to the first embodiment is formed through the following procedure: First, a doped poly-Si film 11 is formed on an Si substrate 10. An IrSi film 12 or an IrSiN film 13 is formed on the poly-Si film 11. Thereafter an Ir film 14 is formed on the IrSi film 12 or the IrSiN film 13. A ferroelectric SBT film 15 is formed on the Ir film 14 as an oxide-based dielectric film. Then, an Ir film 16 is formed on the SBT film 15. Then, annealing is performed in an oxygen atmosphere for sintering the SBT film 15.

The poly-Si film 11 is 600 nm, the IrSi film 12 or the IrSiN film 13 is 100 nm, the Ir film 14 is 100 nm, the SBT film 15 is 300 nm and the Ir film 16 is 100 nm in thickness respectively. The Ir film 16 forms an upper electrode. The IrSi film 12 or the IrSiN film 13 and the Ir film 14 form a lower electrode. The poly-Si film 11 is an electrode material employed as part of the lower electrode or a plug.

In relation to the first embodiment, oxygen diffusion stoppability of the lower electrode formed by the IrSi film 12 or the IrSiN film 13 and the Ir film 14 has been investigated.

Figure 2:
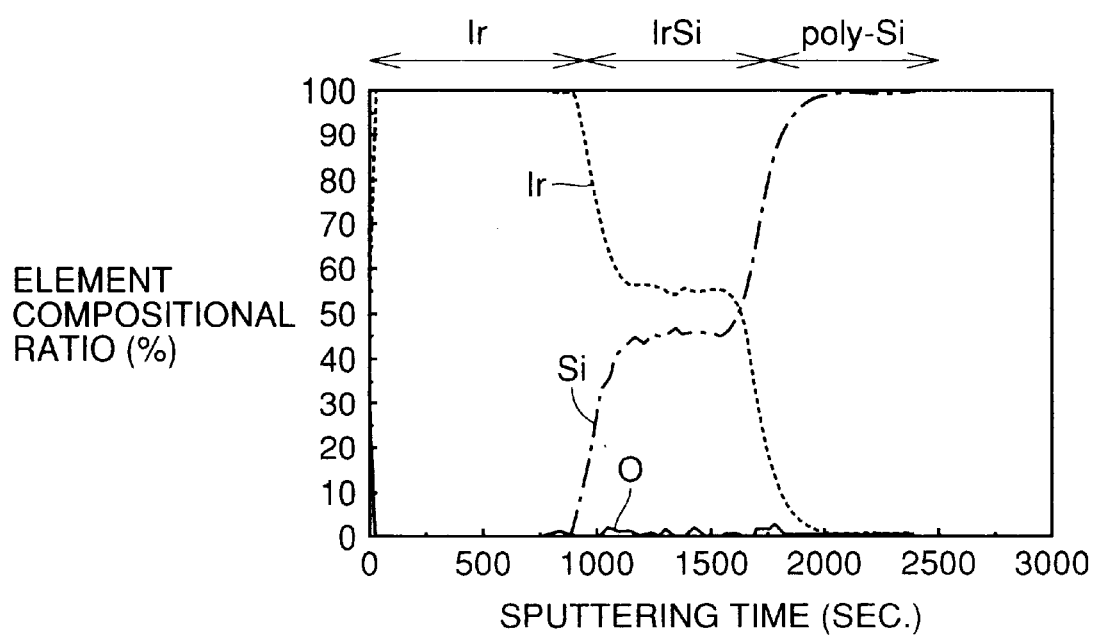
FIGS. 2 to 5 are characteristic diagrams for illustrating effects of the first embodiment of the present invention.
Figure 3:
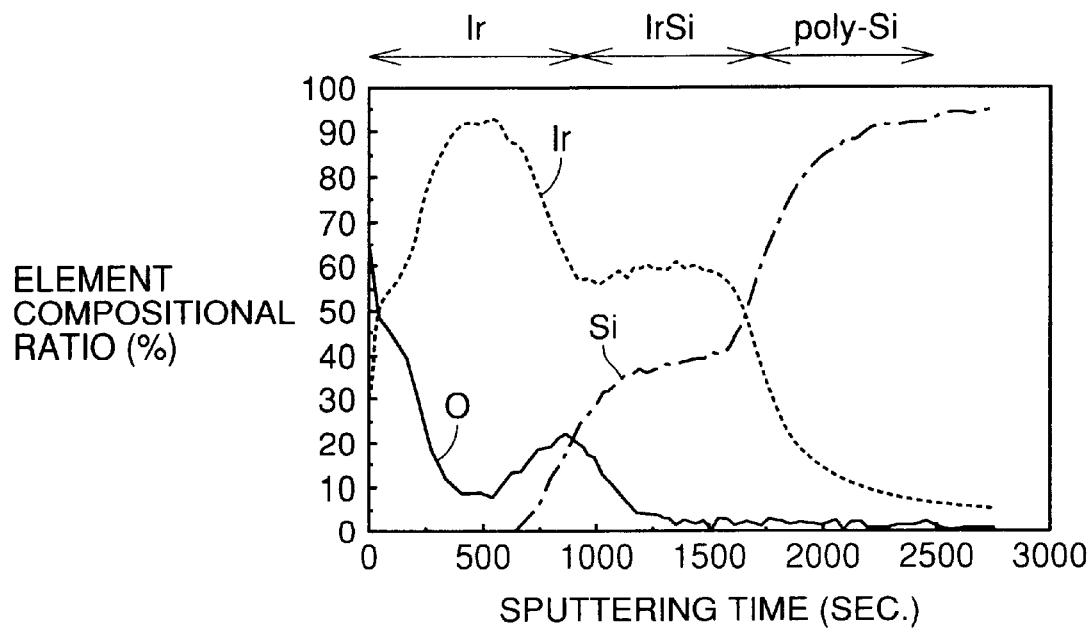

FIGS. 2 and 3 show results of element compositional ratios obtained by X-ray photoelectron spectroscopy (XPS) evaluation along the depth direction in a sample having a multilayer structure of Ir film 14/IrSi film 12/poly-Si film 11 similar to that shown in FIG. 1. FIG. 2 shows results obtained after forming the Ir/IrSi/poly-Si multilayer film, and FIG. 3 shows results obtained after annealing the sample in an oxygen atmosphere at 800° C. for 40 minutes after forming the Ir/IrSi/poly-Si multilayer film. It is understood from the results shown in FIG. 3 that oxygen diffusing by oxygen annealing is stored on the interface between the Ir film 14 and the IrSi film 12. It is also understood that the oxygen content is reduced in the IrSi film 12. Thus, it is understood that the IrSi film 12 stops diffusion of oxygen. The compositional ratio of the IrSi film 12 recognized from the results shown in FIG. 2 was Ir:Si=1:0.75.

Figure 4:
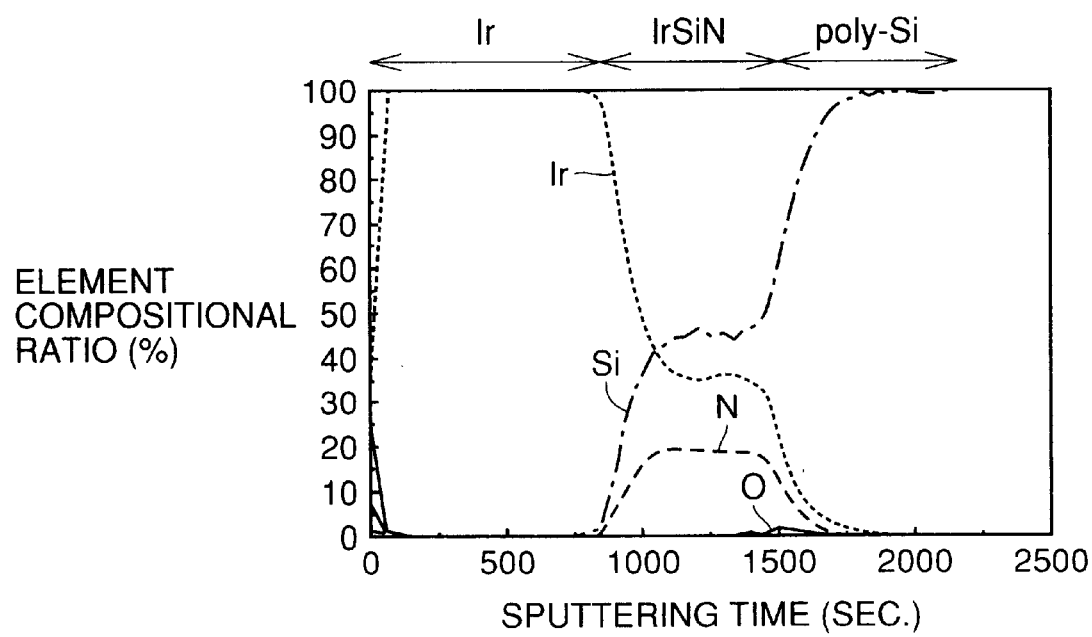
Figure 5:
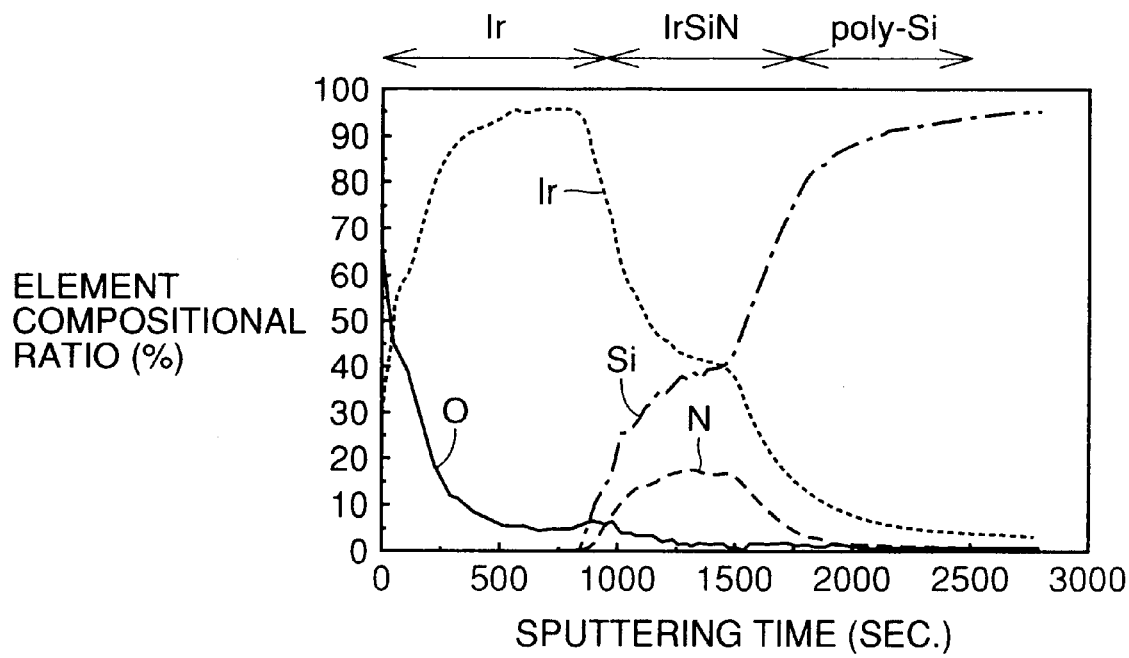

FIGS. 4 and 5 show results of element compositional ratios obtained by XPS evaluation along the depth direction in another sample having a multilayer structure of Ir film 14/IrSiN film 13/poly-Si film 11 similar to that shown in FIG. 1. FIG. 4 shows results obtained after forming the Ir/IrSiN/poly-Si multilayer film, and FIG. 5 shows results obtained after annealing the sample in an oxygen atmosphere at 800° C. for 40 minutes after forming the Ir/IrSiN/poly-Si multilayer film. It is understood from the results shown in FIG. 5 that oxygen diffusing by oxygen annealing is slightly stored on the interface between the Ir film 14 and the IrSiN film 13. It is also understood that the oxygen content is reduced in the IrSiN film 13. Thus, it is understood that the IrSiN film 13 stops diffusion of oxygen.

Comparing the quantities of oxygen stored on the interface between the Ir film 14 and the IrSi film 12 and the interface between the Ir film 14 and the IrSiN film 13, the quantity of oxygen on the latter is smaller than that of the former. Thus, it is understood that the IrSiN film 13 prepared by adding N to the IrSi film 12 has a higher function of stopping diffusion of oxygen than the IrSi film 12. The compositional ratio of the IrSiN film 13 recognized from the results shown in FIG. 4 was Ir:Si:N=1:1.25:0.5.

It is understood that the poly-Si film 11 was hardly oxidized on the interface between the poly-Si film 11 and the IrSi film 12 or the IrSiN film 13 in each of the samples having the multilayer structures of the Ir film 14/IrSi film 12/poly-Si film 11 and the Ir film 14/IrSiN film 13/poly-Si film 11.

When a high-temperature oxygen annealing step is carried out on the structure obtained by successively forming the IrSi film 12 or the IrSiN film 13 and an oxide-based dielectric film such as the SBT film 15 on a conductive material such as the poly-Si film 11 converted to an insulating material when oxidized as in the first embodiment, the IrSi film 12 or the IrSiN film 13 serves as a barrier film for stopping diffusion of oxygen. Thus, the conductive material such as the poly-Si film 11 can be inhibited from oxidation.

The IrSi film 12 has lower resistance than the IrSiN film 13 and hence a barrier film having low resistance and high oxygen diffusion stoppability can be formed with a multilayer film employing the IrSi film 12/IrSiN film 13.

As another exemplary electrode structure according to the first embodiment, the poly-Si film 11 may be replaced with a W film or the Ir films 14 and 16 may be replaced with Pt films or metal films containing Ir or Pt in general.

Second Embodiment

Figure 6:
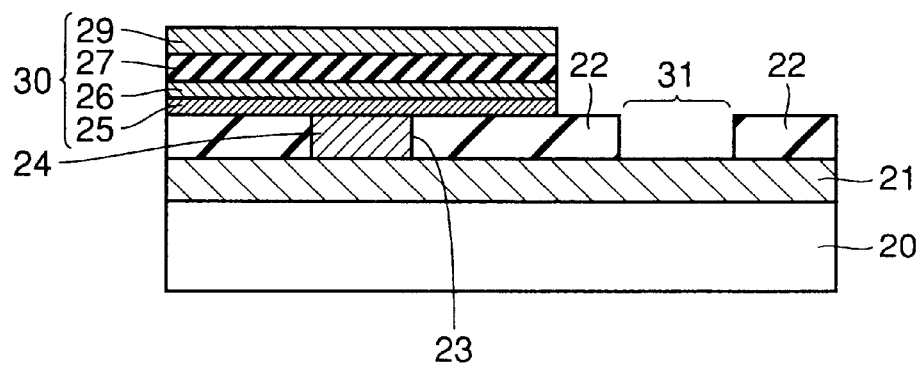
FIG. 6 is a sectional view showing the structure of a capacitor element according to a first example of a second embodiment of the present invention.
Figure 7:
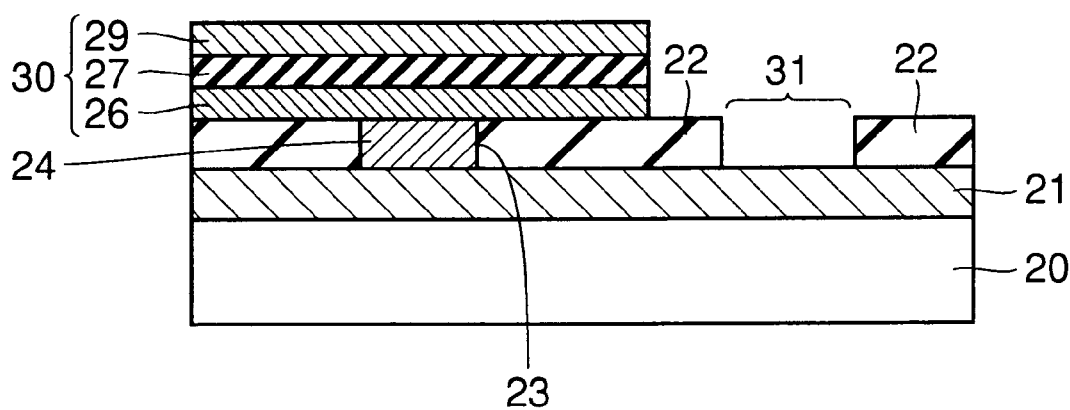
FIG. 7 is a sectional view showing the structure of a comparative capacitor element to be compared with the capacitor element according to the second embodiment of the present invention.
Figure 8:
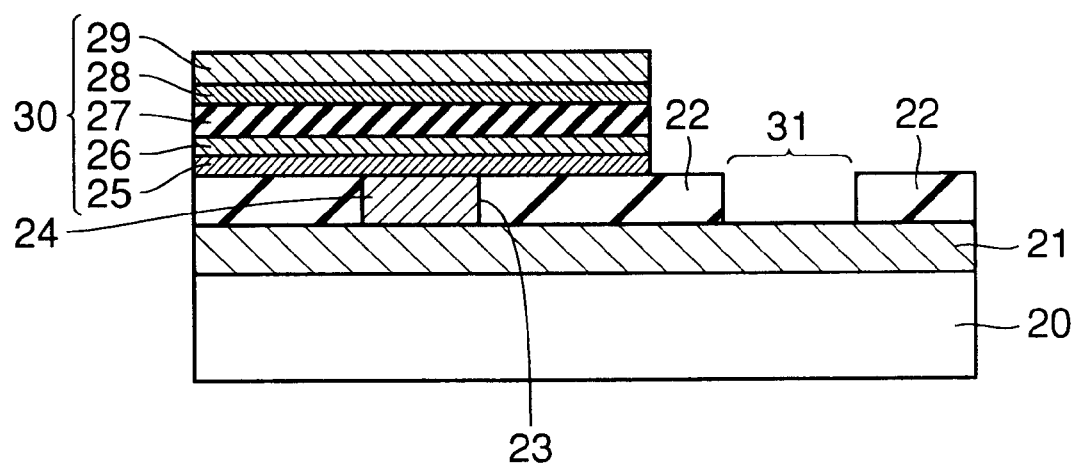
FIG. 8 is a sectional view showing the structure of a capacitor element according to a second example of the second embodiment of the present invention.

A second embodiment of the present invention is now described. FIG. 6 is a sectional view showing the structure of a capacitor element according to a first example of the second embodiment of the present invention, and FIG. 7 is a sectional view showing the structure of a comparative capacitor element to be compared with the capacitor element according to the second embodiment of the present invention. FIG. 8 is a sectional view showing the structure of a capacitor element according to a second example of the second embodiment of the present invention.

The capacitor structure according to the first example of the second embodiment shown in FIG. 6 is formed through the following procedure: First, a WSi film 21 is formed on an Si substrate 20. Then, an interlayer isolation film 22 is formed. A contact hole 23 is formed through the interlayer isolation film 22. A doped poly-Si plug 24 is formed in the contact hole 23. An IrSiN film 25 connected with the poly-Si plug 24 is formed, followed by formation of an Ir film 26. A ferroelectric SBT film 27 is formed on the Ir film 26 as an oxide-based dielectric film. An Ir film 29 is formed on the SBT film 27. Annealing is performed in an oxygen atmosphere at 800° C. for 40 minutes for sintering the SBT film 27. Thereafter the IrSiN film 25, the Ir film 26, the SBT film 27 and the Ir film 29 are patterned by etching, thereby forming a capacitor 30. A hole 31 is formed for bringing a probe into contact with the WSi film 21.

The comparative capacitor element structure shown in FIG. 7 is prepared by eliminating the IrSiN film 25 from the capacitor element structure according to the first example of the second embodiment shown in FIG. 6. The capacitor element structure according to the second example of the second embodiment shown in FIG. 8 is prepared by inserting an IrSiN film 28 between the SBT film 27 and the Ir film 29 in the capacitor element structure according to the first example of the second embodiment shown in FIG. 6. In other words, FIG. 6 shows the case of applying the IrSiN film 25 for stopping diffusion of oxygen to a lower electrode of the capacitor 30, and FIG. 8 shows the case of applying the IrSiN films 25 and 28 to lower and upper electrodes of the capacitor 30 respectively. The comparative capacitor element shown in FIG. 7 has no IrSiN films 25 and 28 applied to electrodes of the capacitor 30.

In each of the capacitor elements shown in FIGS. 6 to 8, the WSi film 21 is 500 nm and the poly-Si plug 24 is 800 nm in thickness respectively. The SBT film 27 employed as an oxide-based dielectric film is 300 nm in thickness. The IrSiN film 25 and the Ir film 26 forming the lower electrode in each of the capacitor elements according to the second embodiment shown in FIGS. 6 and 8 are 100 nm and 200 nm in thickness respectively, while the Ir film 26 forming the lower electrode in the comparative capacitor element shown in FIG. 7 is 200 nm in thickness. The Ir film 29 forming the upper electrode in each of the capacitor elements shown in FIGS. 6 and 7 is 300 nm in thickness, and the IrSiN film 28 and the Ir film 29 forming the upper electrode in the capacitor element shown in FIG. 8 are 100 nm and 200 nm in thickness respectively.

Figure 9:
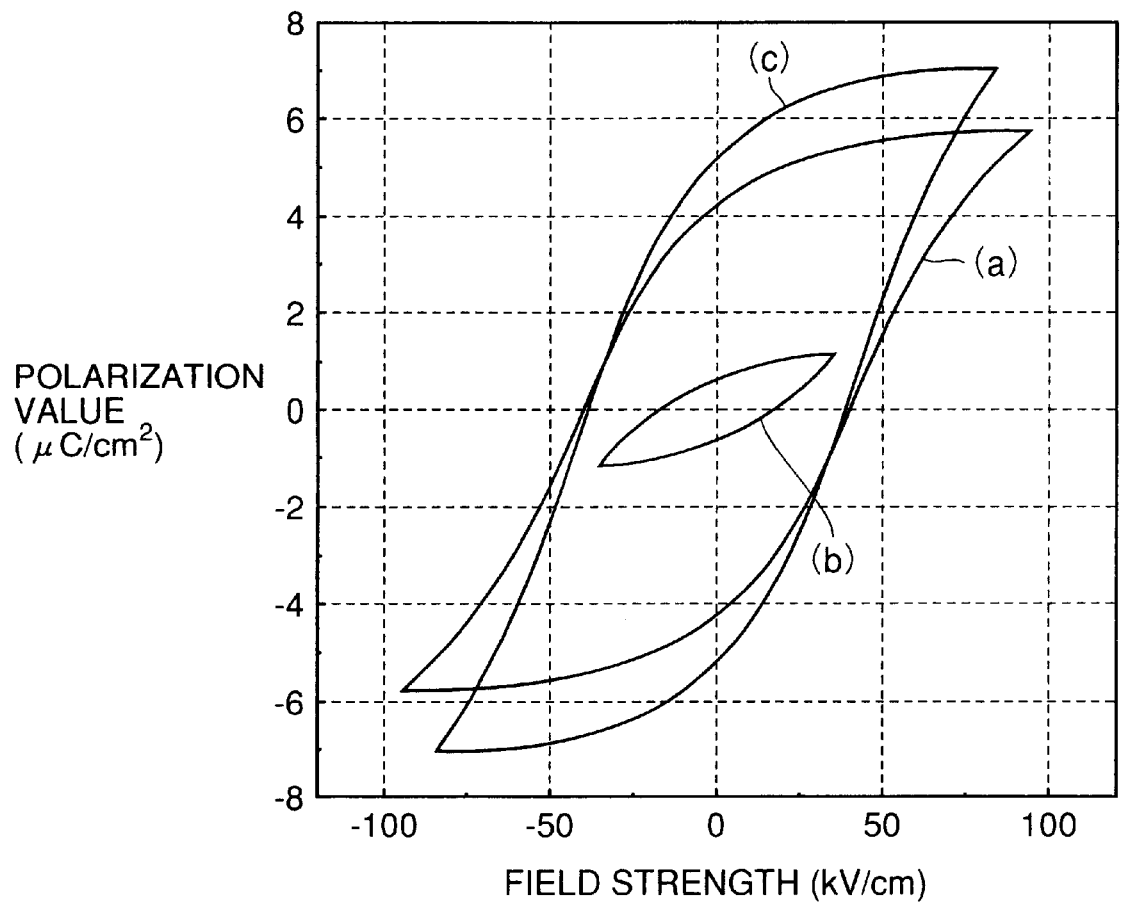
FIG. 9 illustrates the polarization hysteresis characteristics of the capacitor elements shown in FIGS. 6 to 8.

FIG. 9 shows polarization hysteresis characteristics of the ferroelectric capacitors shown in FIGS. 6 to 8 respectively. Referring to FIG. 9, the vertical axis shows polarization values of ferroelectric substances, and the horizontal axis shows the strength of electric fields applied to the capacitors. The capacitor element shown in FIG. 6 exhibits a loop (a) in FIG. 9. In this case, the hysteresis characteristic exhibits an excellent saturation characteristic and a value 2Pr (Pr: remanent polarization value) of about 9 $\mu C/cm^2$.

On the other hand, the comparative capacitor element shown in FIG. 7 exhibits a loop (b) in FIG. 9. In this case, the hysteresis characteristic exhibits no saturation characteristic and the value 2Pr thereof remains at about 2 $\mu C/cm^2$.

The reason for this is conceivably as follows: In the comparative capacitor element structure shown in FIG. 7, oxygen diffuses along grain boundaries of the Ir film 26 in annealing performed in an oxygen atmosphere for sintering the SBT film 27, as hereinabove described. Therefore, the surface of the poly-Si plug 24 is oxidized to form an $SiO_2$ film. A capacitor defined by the $SiO_2$ film is serially connected to the capacitor 30 having the ferroelectric SBT film 27 as a capacitor insulator film and hence no sufficient bias is applied to the capacitor 30. In the capacitor element structure shown in FIG. 6, on the other hand, the IrSiN film 25 stopping diffusion of oxygen is inserted between the poly-Si plug 24 and the Ir film 26 thereby inhibiting oxygen from diffusing into the poly-Si plug 24, whereby an excellent hysteresis characteristic is obtained.

The capacitor element shown in FIG. 8 exhibits a loop (c) in FIG. 9 and has a value 2Pr of about 11 $\mu C/cm^2$ higher than that of the capacitor element shown in FIG. 6. The reason for this is conceivably as follows: In the capacitor element structure shown in FIG. 6, oxygen diffuses from the SBT film 27 into the Ir film 29 in the annealing performed in the oxygen atmosphere to slightly deteriorate the film characteristics of the SBT film 27. In the capacitor element structure shown in FIG. 8, on the other hand, the IrSiN film 28 inserted between the SBT film 27 and the Ir film 29 stops diffusion of oxygen from the SBT film 27. Deterioration of the film characteristics of the SBT film 27 is conceivably therefore suppressed. Thus, it is possible to inhibit an oxide-based dielectric film such as the SBT film 27 from deterioration of film characteristics resulting from annealing by inserting the IrSiN film 28 according to the present invention between a conductive material such as the Ir film 29 and the oxide-based dielectric film such as the SBT film 27.

As shown in the second embodiment, therefore, the inventive oxide-based dielectric capacitor element employing the IrSiN film 25 or 28 serving as a barrier film for stopping diffusion of oxygen can suppress oxidation of a conductive material such as the poly-Si plug 24 converted to an insulating material when oxidized or deterioration of film characteristics of an oxide-based dielectric film such as the SBT film 27 in a capacitor forming step. Consequently, excellent capacitor characteristics can be obtained.

While the IrSiN film 25 or 28 is employed as the barrier film for stopping diffusion of oxygen in the second embodiment, the barrier film is not restricted to this but an IrSi film or an IrSi/IrSiN multilayer film allowing reduction of resistance may alternatively be employed. In the aforementioned multilayer film, the IrSiN film has higher oxygen diffusion stoppability and hence it is possible to effectively stop diffusion of oxygen from the oxide-based dielectric film by arranging the IrSiN film on the side of the SBT film employed as an oxide-based dielectric film.

Third Embodiment

Figure 10:
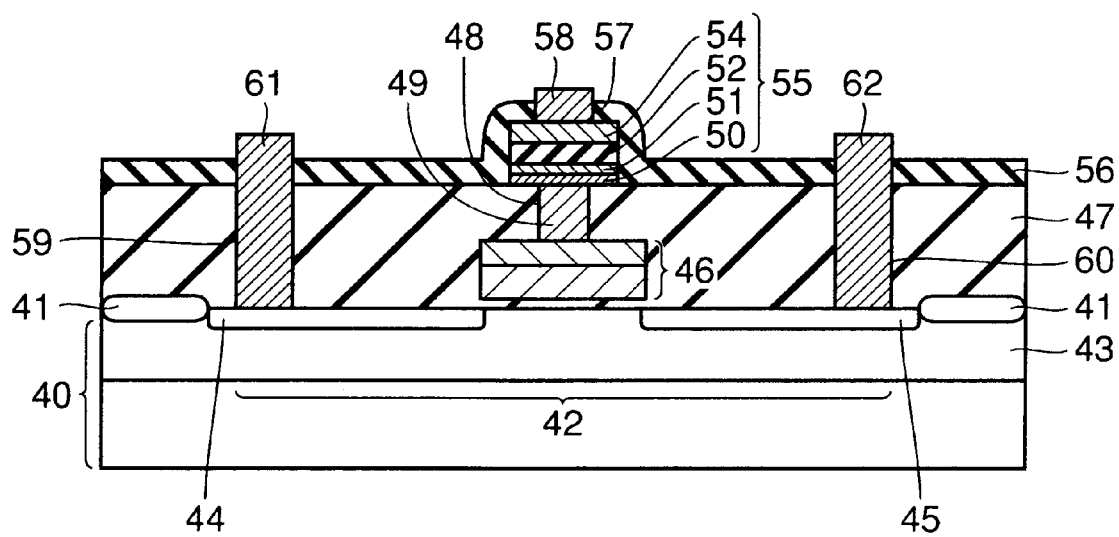
FIG. 10 is a sectional view showing the structure of an FET-type ferroelectric memory according to a first example of a third embodiment of the present invention.
Figure 11:
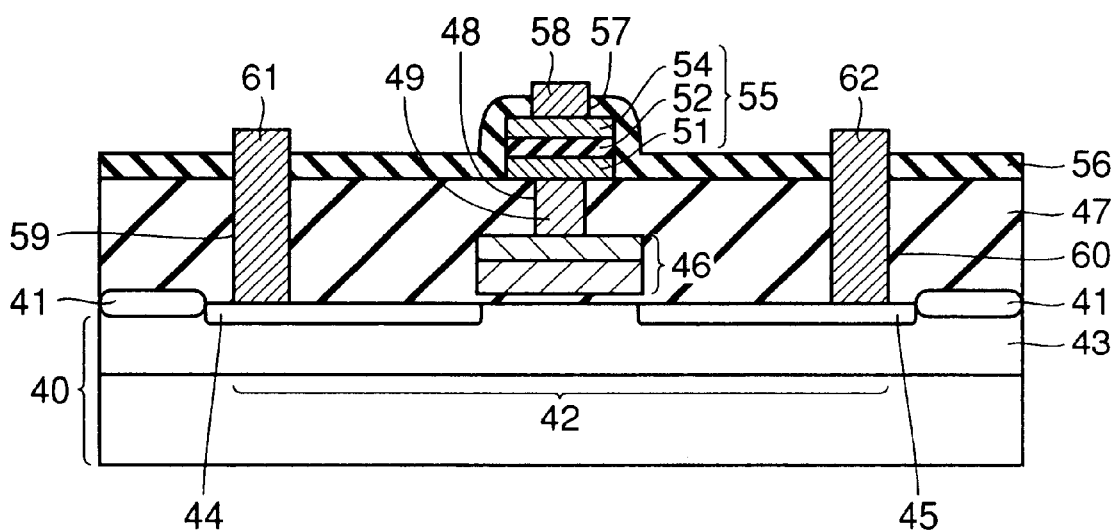
FIG. 11 is a sectional view showing the structure of a comparative FET-type ferroelectric memory to be compared with the FET-type ferroelectric memory according to the third embodiment of the present invention.
Figure 12:
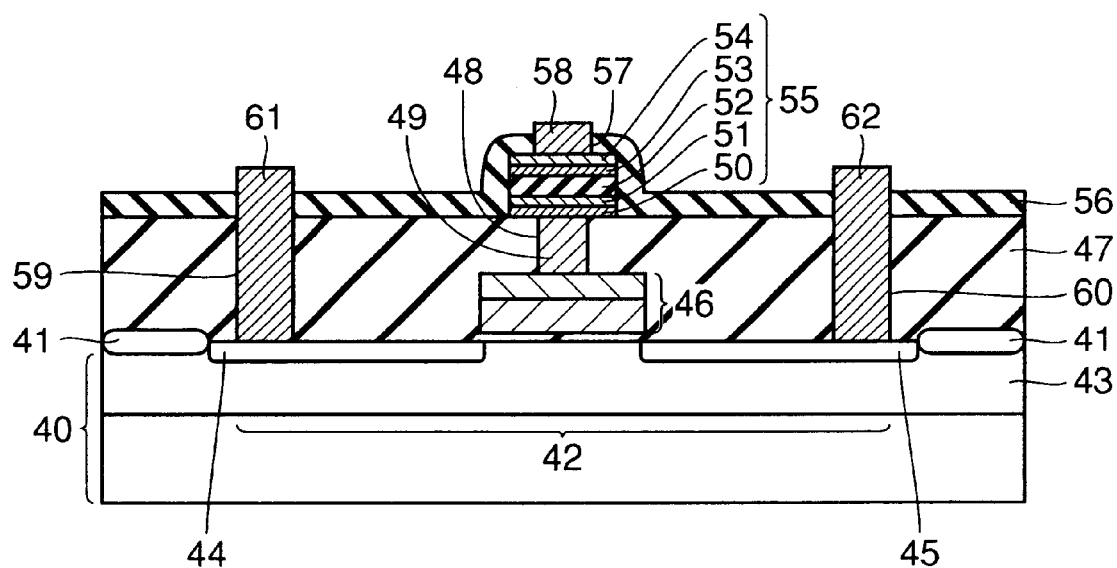
FIG. 12 is a sectional view showing the structure of an FET-type ferroelectric memory according to a second example of the third embodiment of the present invention.

A third embodiment of the present invention is now described. The third embodiment relates to an FET-type ferroelectric memory having a structure obtained by connecting the capacitor element shown in the second embodiment to a gate electrode of a MOS transistor through a plug. FIG. 10 is a sectional view showing an exemplary structure of a ferroelectric memory according to a first example of the third embodiment of the present invention, and FIG. 11 is a sectional view showing the structure of a comparative ferroelectric memory to be compared with the ferroelectric memory according to the third embodiment of the present invention. FIG. 12 is a sectional view showing an exemplary structure of a ferroelectric memory according to a second example of the third embodiment of the present invention.

The ferroelectric memory according to the first example of the third embodiment shown in FIG. 10 is formed through the following procedure: First, an isolation oxide film 41 and a well region 43 for a MOS transistor 42, a source region 44, a drain region 45 and a WSi/poly-Si gate electrode 46 are formed on a silicon substrate 40. Thereafter a first interlayer isolation film 47 is formed. A contact hole 48 is formed on the gate electrode 46, followed by formation of a poly-Si plug 49. Thereafter an IrSiN film 50 and an Ir film 51 are formed on the first interlayer isolation film 47 and the poly-Si plug 49. Then, a ferroelectric SBT film 52 is formed on the Ir film 51 as an oxide-based dielectric film.

An Ir film 54 is formed on the SBT film 52. Annealing is performed in an oxygen atmosphere at 800° C. for 40 minutes for sintering the SBT film 52. Thereafter the IrSiN film 50, the Ir film 51, the SBT film 52 and the Ir film 54 are patterned by etching, thereby forming a capacitor 55. After forming a second interlayer isolation film 56, a contact hole 57 is formed on the Ir film 54 forming an upper electrode of the capacitor 55. A conductive layer 58 is formed to fill up the contact hole 57.

Thereafter contact holes 59 and 60 are formed on the source region 44 and the drain region 45 respectively. A source electrode 61 and a drain electrode 62 are formed to fill up the contact holes 59 and 60 respectively. The conductive layer 58, the source electrode 61 and the drain electrode 62 are made of TiN/Al-Si-Cu/TiN/Ti or the like, for example.

Operations of the FET-type ferroelectric memory according to the first example of the third embodiment shown in FIG. 10 are now described. First, a sufficient positive voltage is applied to the conductive layer 58 in order to invert polarization of the ferroelectric SBT film 52, and thereafter the voltage of the conductive layer 58 is set to zero again. Thus, the interface between the SBT film 52 and the Ir film 54 is negatively charged while the interface between the SBT film 52 and the Ir film 51 forming a lower electrode is positively changed.

In this case, the interface between the Ir film 51 and the SBT film 52 is negatively charged and the interface between the gate electrode 46 and a gate insulator film is positively charged. Consequently, an inversion layer is formed on a channel region between the source region 44 and the drain region 45. Thus, the FET enters an ON state although the voltage of the conductive layer 58 and that of the Ir film 54 forming the upper electrode are zero.

Then, in order to contrarily invert the polarization of the SBT film 52, a sufficient negative voltage is applied to the conductive layer 58 and thereafter the voltage of the conductive layer 58 is set to zero again. Thus, the interface between the SBT film 52 and the Ir film 54 is positively charged while the interface between the SBT film 52 and the Ir film 51 is negatively charged.

In this case, the interface between the Ir film 51 forming the lower electrode and the SBT film 52 is positively charged thereby negatively charging the interface between the gate electrode 46 and the gate insulator film. Consequently, no inversion layer is formed on the channel region between the source region 44 and the drain region 45 but the FET enters an OFF state.

Thus, when the SBT film 52 forming the ferroelectric film is sufficiently inverted in polarization, the FET can be selectively turned on or off also after setting the voltage applied to the conductive layer 58 as well as the Ir film 54 forming the upper electrode to zero. Thus, data "1" and "0" stored in the ferroelectric memory can be determined by detecting a source-to-drain current.

The comparative ferroelectric memory structure shown in FIG. 11 is obtained by eliminating the IrSiN film 50 from the ferroelectric memory structure according to the first example of the third embodiment shown in FIG. 10. The ferroelectric memory structure according to the second example of the third embodiment shown in FIG. 12 is obtained by inserting an IrSiN film 53 between the SBT film 52 and the Ir film 54 in the ferroelectric memory structure according to the first example of the third embodiment shown in FIG. 10.

In other words, the FET-type ferroelectric memory structure shown in FIG. 10 employs the IrSiN film 50 for stopping diffusion of oxygen as the lower electrode of the capacitor 55, while the FET-type ferroelectric memory structure shown in FIG. 12 employs the IrSiN films 50 and 53 as lower and upper electrodes of the capacitor 55 respectively. The comparative FET-type ferroelectric memory structure shown in FIG. 11 employs no IrSiN films 50 and 53 as electrodes of the capacitor 55.

The capacitor element structures according to the third embodiment are similar to the three types of structures according to the aforementioned second embodiment. The areas AF and AG of the capacitor 55 and a capacitor formed by the gate insulator film ($SiO_2$) are set in the ratio AF:AG= 1:20.

Figure 13:
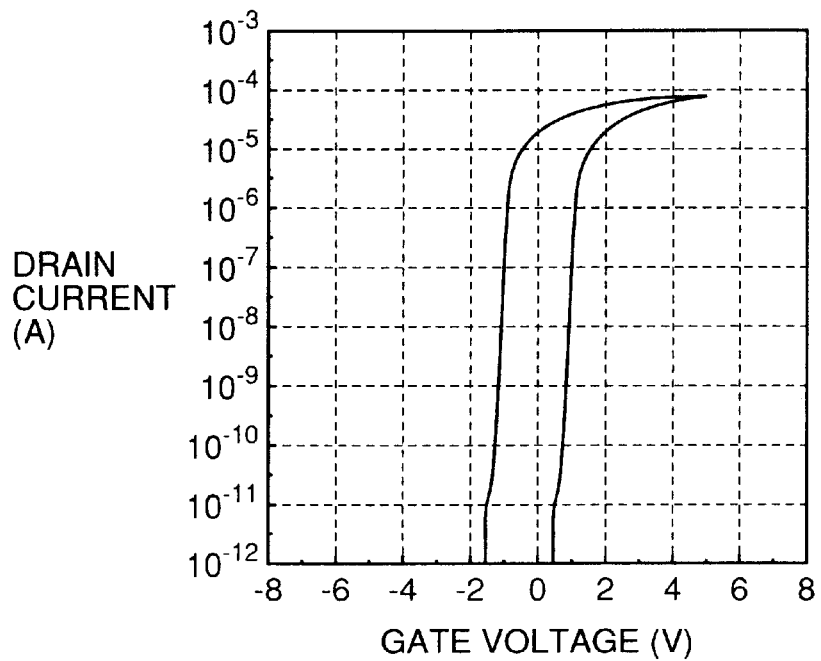
FIG. 13 illustrates the characteristics of the FET-type ferroelectric memory according to the first example of the third embodiment of the present invention.
Figure 14:
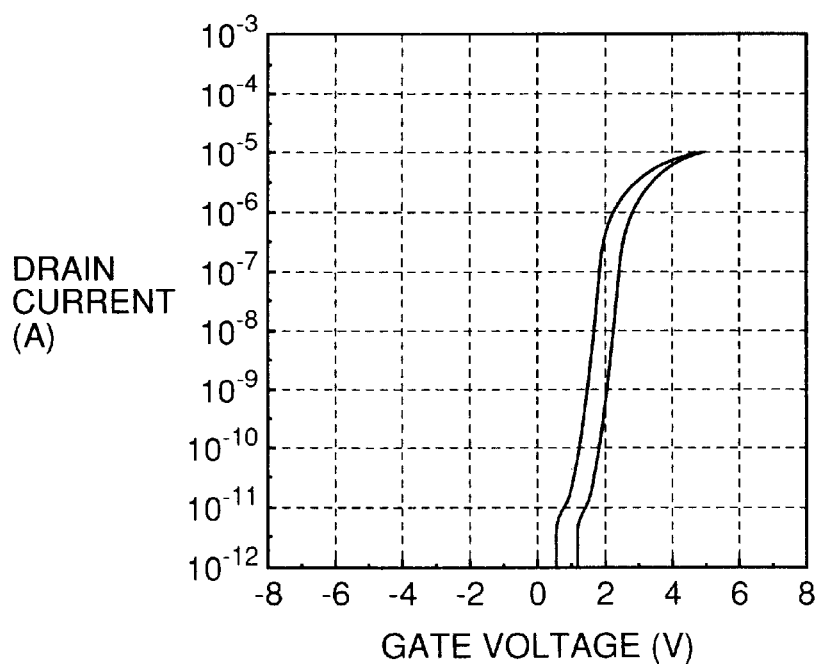
FIG. 14 illustrates the characteristics of the comparative FET-type ferroelectric memory to be compared with the FET-type ferroelectric memory according to the third embodiment of the present invention.
Figure 15:
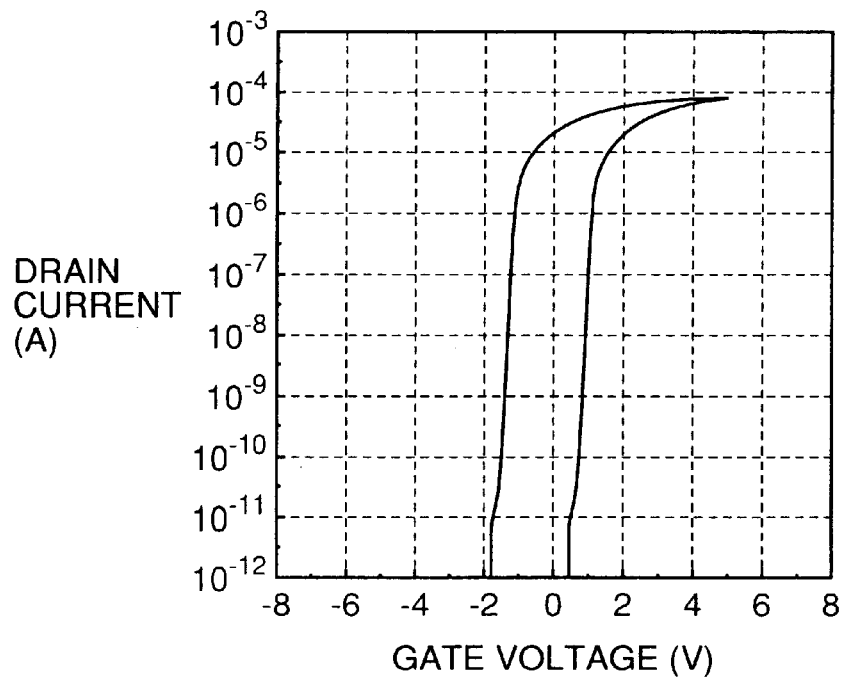
FIG. 15 illustrates the characteristics of the FET-type ferroelectric memory according to the second example of the third embodiment of the present invention.

FIGS. 13 to 15 are graphs plotting drain currents and voltages (referred to as gate voltages) applied to the conductive layers 58 on the vertical and horizontal axes respectively. In each graph, source and drain voltages are set to 0 V and 0.1 V respectively. The potential of the well region 43 is set identical to the source voltage. FIG. 13 shows the results of the ferroelectric memory according to the first example of the third embodiment shown in FIG. 10. In this case, the shift quantity of a threshold voltage Vt is about 2.0 V, as shown in FIG. 13. FIG. 14 shows the results of the comparative ferroelectric memory shown in FIG. 11. It is understood that the shift quantity of the threshold voltage Vt is only about 0.5 V in this case, as shown in FIG. 13. FIG. 14 shows the results of the ferroelectric memory according to the second example of the third embodiment shown in FIG. 12. The shift quantity of the threshold voltage Vt is further improved to 2.2 V as compared with the ferroelectric memory shown in FIG. 10, as shown in FIG. 15.

As shown in the third embodiment, therefore, a ferroelectric memory having excellent storage characteristics can be prepared by applying the inventive oxide-based ferroelectric capacitor element employing the IrSiN film 50 or 53 serving as a barrier film for stopping diffusion of oxygen.

Fourth Embodiment

Figure 16:
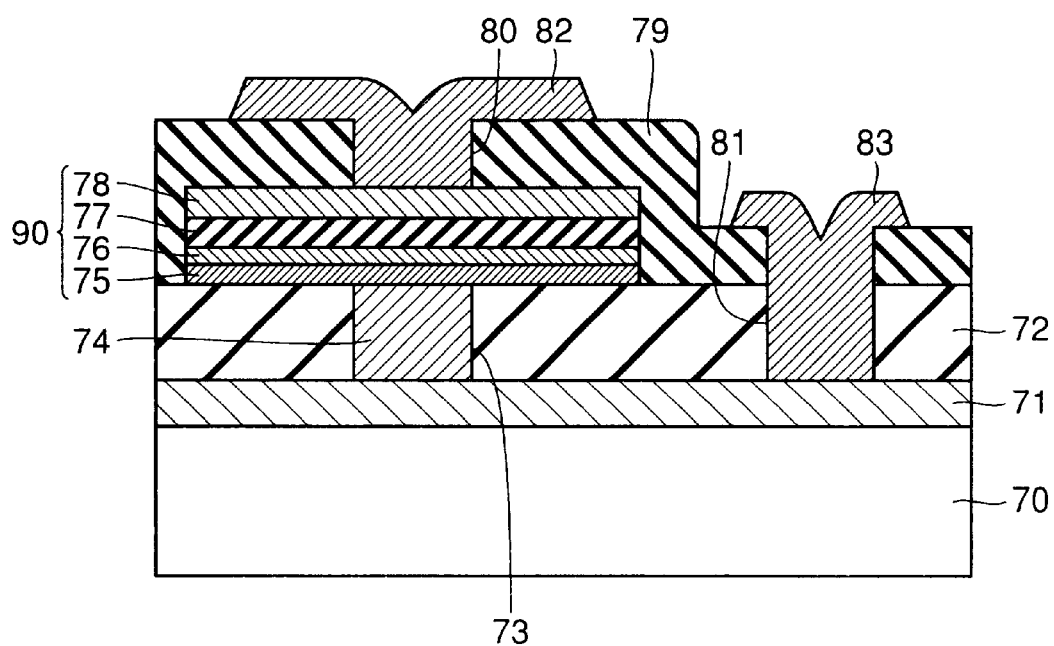
FIG. 16 is a sectional view showing the structure of a capacitor element according to a fourth embodiment of the present invention.

FIG. 16 is a sectional view showing a capacitor element according to a fourth embodiment of the present invention. The capacitor structure according to the fourth embodiment shown in FIG. 16 is formed through the following procedure: First, an n-type doping layer 71 is formed on an Si substrate 70. An interlayer isolation film 72 is formed on the n-type doping layer 71. A contact hole 73 is formed through the interlayer isolation film 72. A poly-Si plug 74 is formed in the contact hole 73. A PtSiN barrier film 75 is formed to be connected with the poly-Si plug 74. Then, a Pt film 76 is formed on the PtSiN barrier film 75. A ferroelectric SBT film 77 is formed on the Pt film 76 as an oxide-based dielectric film.

The SBT film 77 is formed by a sol-gel method. In this case, the SBT film 77 is prebaked under conditions of 300° C. and five minutes. Thereafter a Pt film 78 is formed on the SBT film 77. The Pt film 78, the SBT film 77, the Pt film 76 and the PtSiN film 75 are patterned by etching, thereby forming a capacitor 90. Thereafter annealing is performed in an oxygen atmosphere at 800° C. for 40 minutes, for sintering the SBT film 77.

After forming an interlayer isolation film 79, contact holes 80 and 81 are formed on the Pt film 78 and the n-type doping layer 71 respectively. Electrodes 82 and 83 are formed in the contact holes 80 and 81 respectively. The electrodes 82 and 83 are made of TiN/Al-Si-Cu/TiN/Ti or the like, for example.

Figure 17:
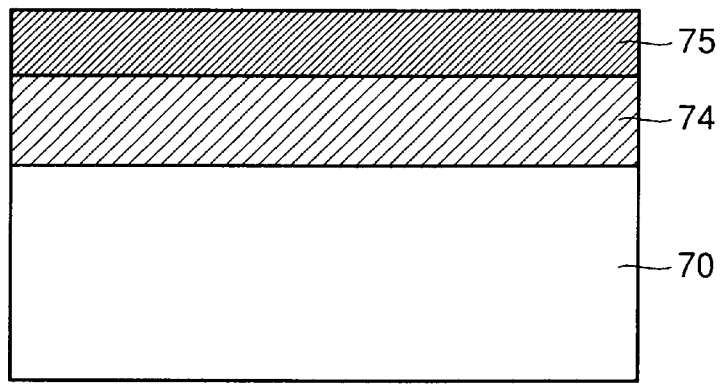
FIG. 17 is a sectional view showing the structure of a sample for evaluating oxygen diffusion stoppability according to the fourth embodiment of the present invention.
Figure 18:
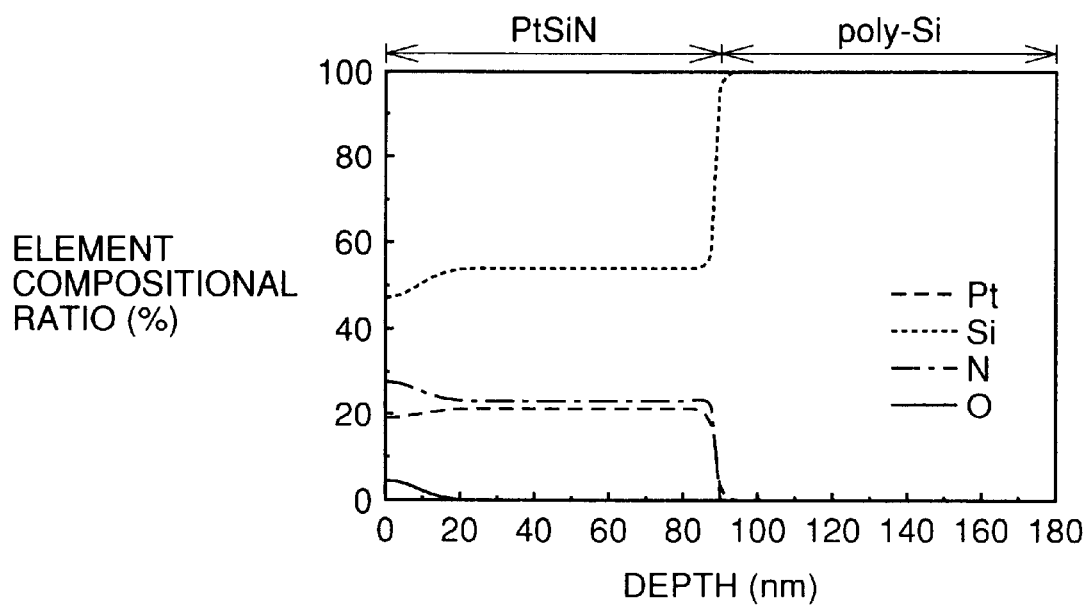
FIG. 18 is a characteristic diagram for illustrating an effect of the fourth embodiment of the present invention.

FIG. 17 is a sectional view showing the structure of a sample prepared for investigating oxygen diffusion stoppability of the PtSiN barrier film 75 according to the fourth embodiment. Referring to FIG. 17, a multilayer structure of the PtSiN barrier film 75 and the poly-Si film 74 is formed on the Si substrate 70 in this sample. The prepared sample was annealed in an oxygen atmosphere at 800° C. for 40 minutes, and thereafter an element compositional ratio was investigated by RBS (Rutherford backscattering spectrometry) along the depth of the multilayer structure. FIG. 18 shows the element compositional ratio of the multilayer film along the depth direction.

As shown in FIG. 18, the oxygen compositional ratio is reduced in the range of depth of about 20 nm from the surface in the PtSiN barrier film 75. The oxygen compositional ratio is not more than 5.2%. Thus, it is understood that the PtSiN barrier film 75 sufficiently stops diffusion of oxygen.

Pt forms no nitride, and hence Pt is bonded with Si and N is bonded Si when forming PtSiN. Therefore, the PtSiN film conceivably has a structure obtained by embedding Si—N in Pt—Si. It is conceivable that the PtSiN barrier film 75 consequently can have both the oxygen diffusion stoppability of a silicon nitride (Si—N) film and conductivity of Pt—Si (metal silicide).

No oxidization of poly-Si. i.e., no generation of an $SiO_2$ film is observed on the interface between PtSiN and poly-Si due to inhibition of oxygen diffusion by the PtSiN barrier film 75.

Figure 19:
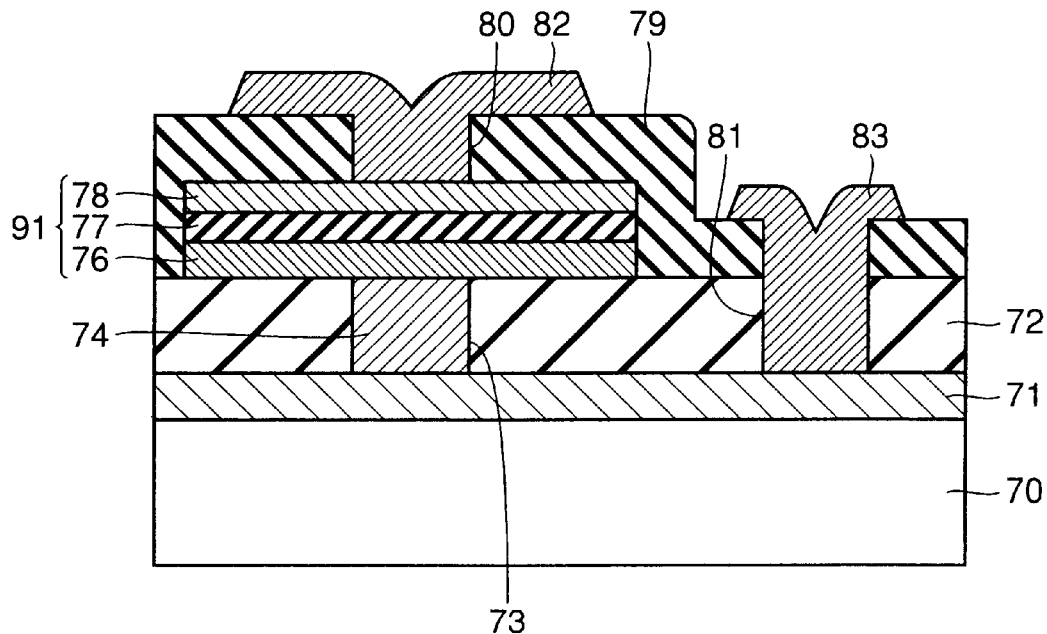
FIG. 19 is a sectional view showing the structure of a comparative capacitor element to be compared with the capacitor element according to the fourth embodiment of the present invention.
Figure 20:
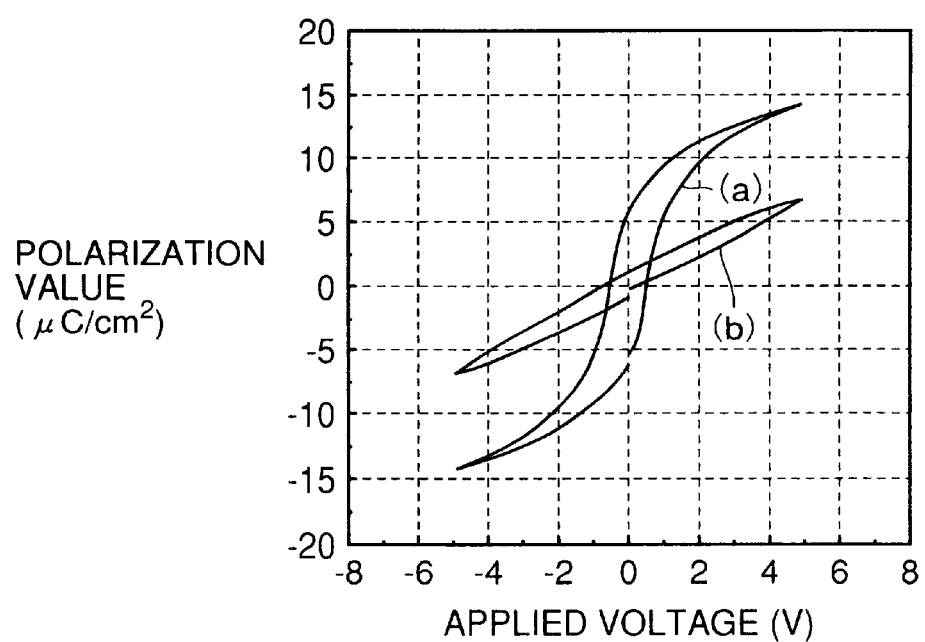
FIG. 20 is a characteristic diagram for illustrating another effect according to the fourth embodiment of the present invention.

FIG. 19 is a sectional view showing a comparative capacitor structure prepared to be compared with the ferroelectric capacitor structure according to the fourth embodiment shown in FIG. 16. The comparative ferroelectric capacitor structure shown in FIG. 19 is prepared by eliminating the PtSiN barrier film 75 from the ferroelectric capacitor structure according to the fourth embodiment shown in FIG. 16. In each of the ferroelectric capacitor structures shown in FIGS. 16 and 19, the thickness of the SBT film 77 is set to 200 nm. FIG. 20 shows results of polarization hysteresis characteristics of these capacitor structures.

Referring to FIG. 20, the vertical and horizontal axes show polarization values of the ferroelectric substances and voltages applied to the capacitors respectively. A loop (a) in FIG. 20 shows the characteristics of the ferroelectric capacitor according to the fourth embodiment shown in FIG. 16, and a loop (b) in FIG. 20 shows the characteristics of the comparative ferroelectric capacitor shown in FIG. 19. The hysteresis characteristic of the capacitor structure according to the fourth embodiment shown in FIG. 16 exhibits an excellent saturation characteristic as shown in the loop (a) of FIG. 20, and the value 2Pr (Pr: remanent polarization value) thereof is about 13 $\mu C/cm^2$. On the other hand, the hysteresis characteristic of the comparative capacitor structure shown in FIG. 19 exhibits no saturation characteristic and the value 2Pr thereof remains at about 2 $\mu C/cm^2$, as shown in the loop (b) in FIG. 20.

The reason for this is conceivably as follows: In the comparative capacitor element structure shown in FIG. 19, oxygen diffuses along grain boundaries of the Pt film 76 in annealing (at 800° C. for 40 minutes) performed in an oxygen atmosphere for sintering the SBT film 77. Therefore, the surface of the poly-Si plug 74 is oxidized to form an $SiO_2$ film. A capacitor formed by this $SiO_2$ film is serially connected to the capacitor 91 having the ferroelectric SBT film 77 as a capacitor insulator film, and hence no sufficient bias is conceivably applied to the capacitor 91.

In the capacitor element structure according to the fourth embodiment shown in FIG. 16, on the other hand, the PtSiN barrier film 75 for stopping diffusion of oxygen is inserted between the poly-Si plug 74 and the Pt film 76, thereby inhibiting oxygen from diffusing into the poly-Si plug 74. Therefore, the poly-Si plug 74 is not oxidized but an excellent hysteresis characteristic can be attained as a result.

Therefore, the inventive oxide-based dielectric capacitor element employing the PtSiN barrier film 75 serving as a barrier film for stopping diffusion of oxygen can suppress oxidation of a conductor film such as the poly-Si plug 74 converted to an insulating material when oxidized in a capacitor forming step. Consequently, an excellent capacitor characteristic can be attained.

Figure 21:
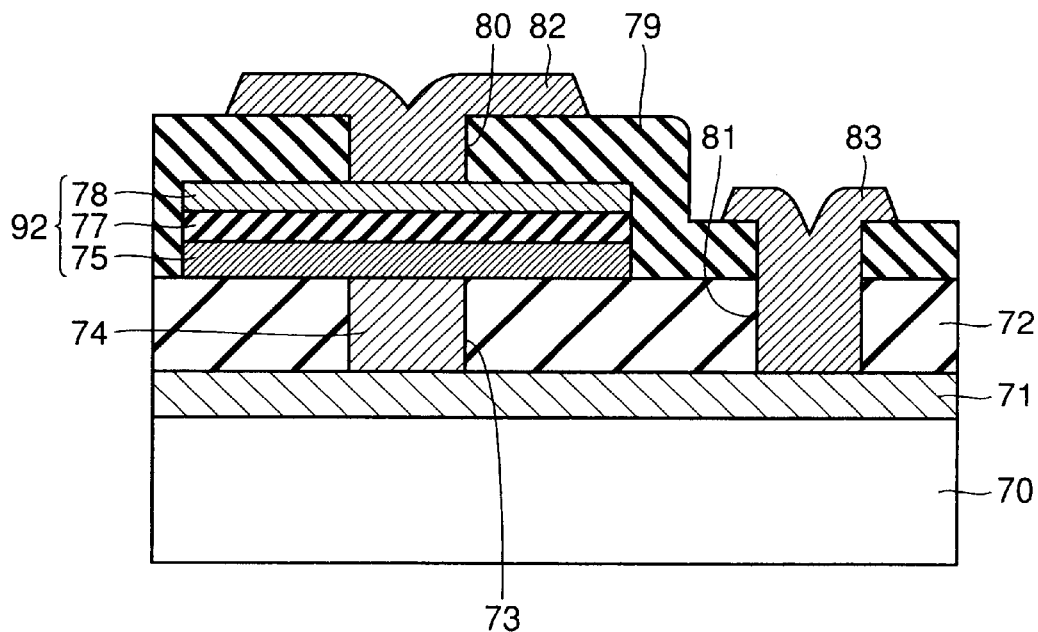
FIG. 21 is a sectional view showing the structure of another comparative capacitor element to be compared with the capacitor element according to the fourth embodiment of the present invention.

The effect of the Pt film 76, which is a conductive crystal film, inserted between the PtSiN barrier film 75 and the SBT film 77 which is an oxide-based dielectric film is studied in the capacitor element according to the fourth embodiment. FIG. 21 is a sectional view showing a comparative capacitor structure prepared to be compared with the ferroelectric capacitor structure according to the fourth embodiment shown in FIG. 16. The comparative structure shown in FIG. 21 is obtained by eliminating the Pt film 76 from the ferroelectric capacitor according to the fourth embodiment shown in FIG. 16.

Figure 22:
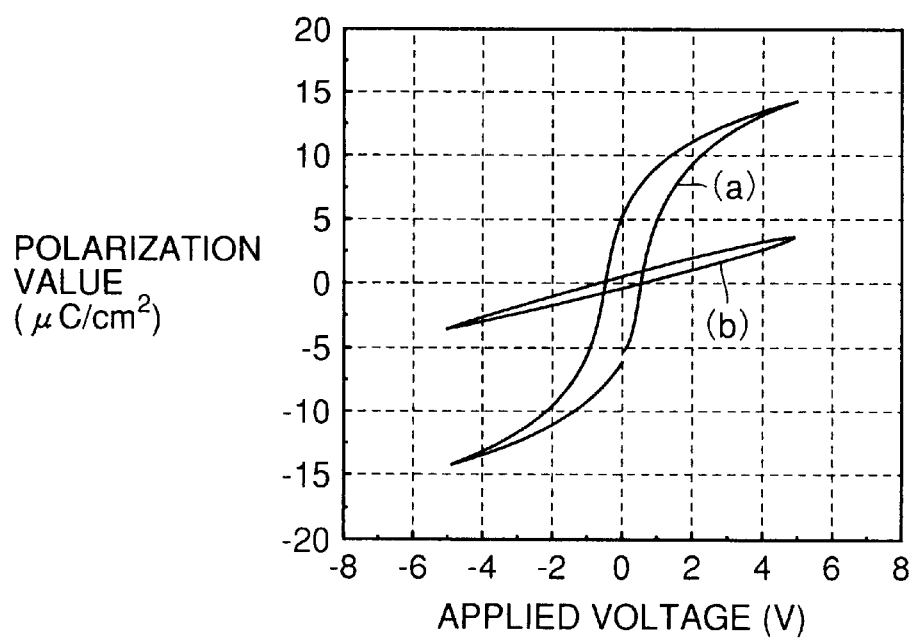
FIG. 22 is a characteristic diagram for illustrating still another effect of the fourth embodiment of the present invention.

In each of the structure according to the fourth embodiment shown in FIG. 16 and the comparative structure shown in FIG. 21, the thickness of the SBT film 77 is set to 200 nm. FIG. 22 shows results of polarization hysteresis characteristics of these capacitor structures. Referring to FIG. 22, the vertical and horizontal axes show polarization values of the ferroelectric substances and voltages applied to the capacitors respectively. A loop (a) in FIG. 22 shows the characteristics of the ferroelectric capacitor according to the fourth embodiment shown in FIG. 16, and a loop (b) in FIG. 22 shows the characteristics of the comparative ferroelectric capacitor shown in FIG. 21.

The hysteresis characteristic of the capacitor structure according to the fourth embodiment shown in FIG. 16 exhibits an excellent saturation characteristic as shown in the loop (a) of FIG. 22, and the value 2Pr thereof is about 13 $\mu C/cm^2$. On the other hand, the hysteresis characteristic of the comparative capacitor structure shown in FIG. 21 exhibits no saturation characteristic and the value 2Pr thereof remains at about 1 $\mu C/cm^2$, as shown in the loop (b) in FIG. 22.

The reason for this is conceivably as follows: When observing the comparative structure shown in FIG. 21 by SEM (scanning electron microscopy), the SBT film 77 exhibits a considerable quantity of space. Thus, this space serves as a capacitor serially connected to the capacitor 92 including the SBT film 77 similarly to the aforementioned capacitor formed by the $SiO_2$ film. It is conceivable that no sufficient voltage is therefore applied to the capacitor 92 including the SBT film 77. Such a large quantity of space is formed in the SBT film 77 conceivably because the initial growth nuclear concentration in crystallization of the SBT film 77 is small when forming the oxide-based dielectric film on amorphous PtSiN. In order to increase the initial growth nuclear concentration, it is preferable to form a crystal film such as the Pt film 76 and thereafter form the oxide-based dielectric film as in the fourth embodiment shown in FIG. 16.

Therefore, the quality of the SBT film 77 can be improved by inserting a conductive crystal film such as the Pt film 76 between the PtSiN barrier film 75 serving as a barrier film for stopping diffusion of oxygen and the SBT film 77 of an oxide dielectric material. Consequently, an excellent capacitor characteristic can be attained.

Fifth Embodiment

Figure 23:
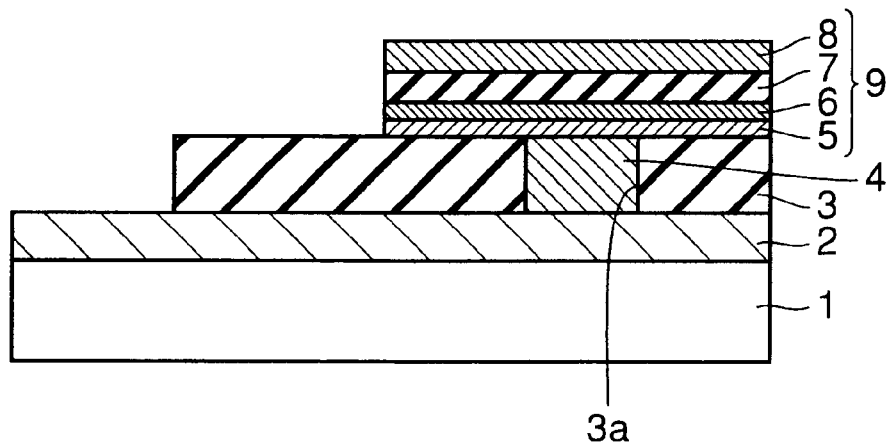
FIG. 23 is a sectional view showing a ferroelectric capacitor element according to a fifth embodiment of the present invention.
Figure 24:
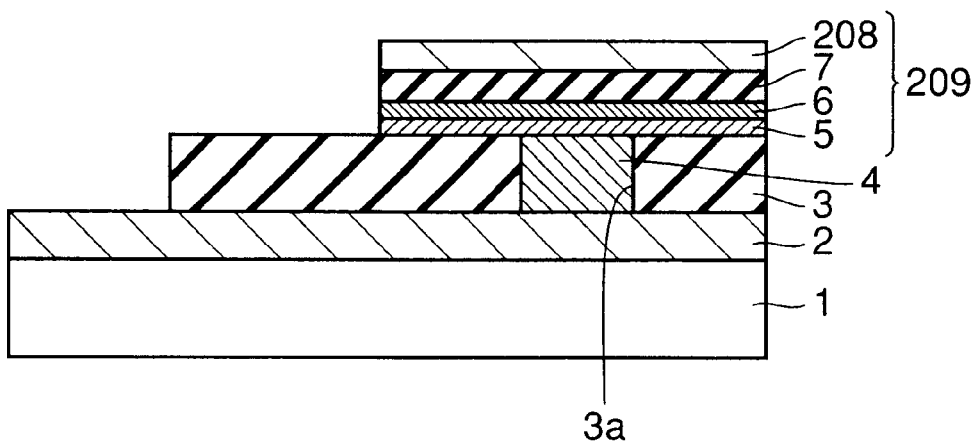
FIG. 24 is a sectional view showing a comparative ferroelectric capacitor element to be compared with the ferroelectric capacitor element according to the fifth embodiment shown in FIG. 23.

FIG. 23 is a sectional view showing a ferroelectric capacitor element according to a fifth embodiment of the present invention. FIG. 24 is a sectional view showing a comparative ferroelectric capacitor element formed to be compared with the ferroelectric capacitor element according to the fifth embodiment shown in FIG. 23.

Referring to FIG. 23, the capacitor element according to the fifth embodiment of the present invention is formed through the following procedure: First, a tungsten silicide (WSi) film 2 is formed on an Si substrate 1. After forming an interlayer isolation film 3 on the WSi film 2, a contact hole 3a is formed through the interlayer isolation film 3. A polycrystalline silicon plug 4 consisting of doped polycrystalline silicon is formed in the contact hole 3a.

An $IrO_2$ film 5 is formed to be connected with the polycrystalline silicon plug 4, and an Ir film 6 is formed thereon. The $IrO_2$ film 5 and the Ir film 6 form a capacitor lower electrode. An SBT film 7 serving as a ferroelectric film is formed on the Ir film 6. An IrSiN film 8 serving as a capacitor upper electrode is formed on the SBT film 7. The $IrO_2$ film 5, the Ir film 6, the SBT film 7 and the IrSiN film 8 are patterned by etching, thereby forming a capacitor 9. Thereafter annealing is performed for crystallizing the SBT film 7. The SBT film 7 corresponds to the "insulator film" of the present invention, and the IrSiN film 8 corresponds to the "first conductor film" and the "upper electrode" of the present invention.

In other words, the fifth embodiment shown in FIG. 23 employs the IrSiN film 8 as the upper electrode of the ferroelectric capacitor 9.

On the other hand, the comparative ferroelectric capacitor element shown in FIG. 24 employs an Ir film 208 in place of the IrSiN film 8 forming the upper electrode in the structure of the capacitor element according to the fifth embodiment shown in FIG. 23. In other words, the comparative ferroelectric capacitor element shown in FIG. 24 employs the Ir film 208 as an upper electrode of a ferroelectric capacitor 209. The remaining structure of the comparative capacitor shown in FIG. 24 is similar to that of the fifth embodiment shown in FIG. 23.

In each of the structures shown in FIGS. 23 and 24, annealing is performed in an oxygen atmosphere at 800° C. for 40 minutes in crystallization of the SBT film 7 serving as a ferroelectric film.

Figure 25:
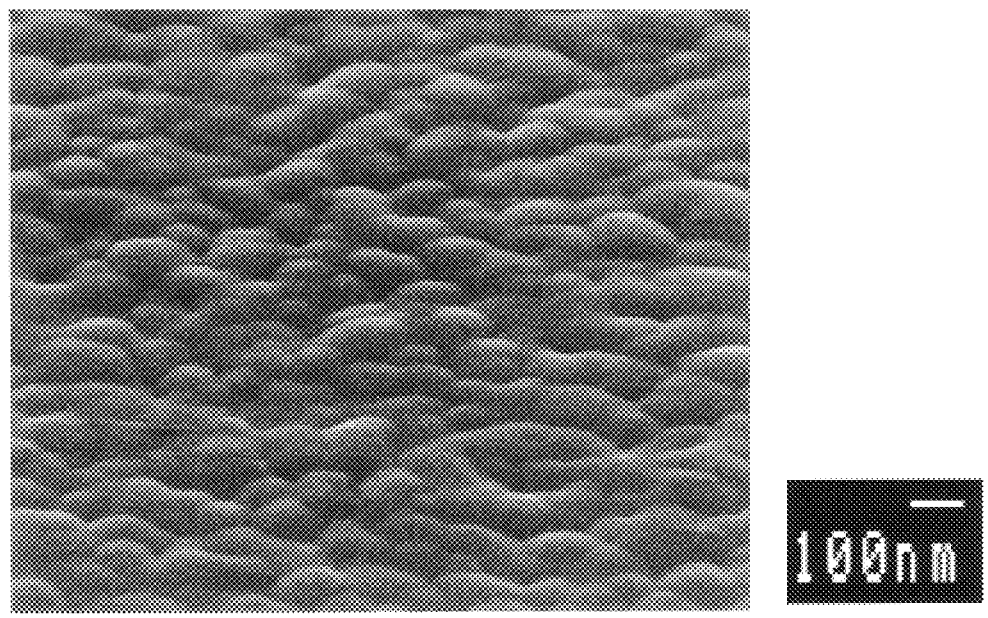
FIG. 25 is a microphotograph showing the surface of an upper electrode subjected to oxygen annealing observed with an SEM (Scanning Electron Microscopy) in the ferroelectric capacitor element according to the fifth embodiment shown in FIG. 23.
Figure 26:
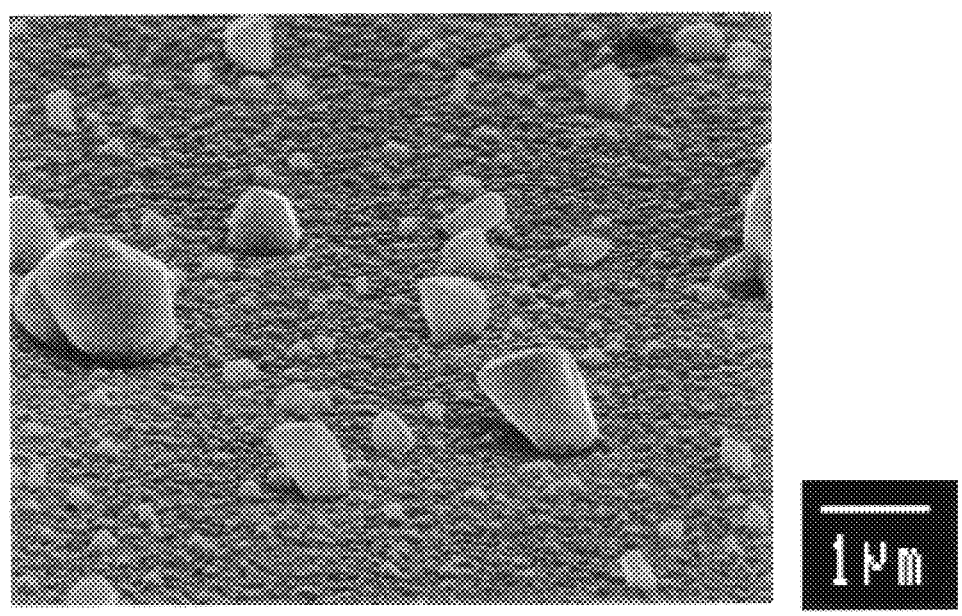
FIG. 26 is a microphotograph showing the surface of an upper electrode subjected to oxygen annealing observed with an SEM in the comparative ferroelectric capacitor element shown in FIG. 24.
Figure 31:
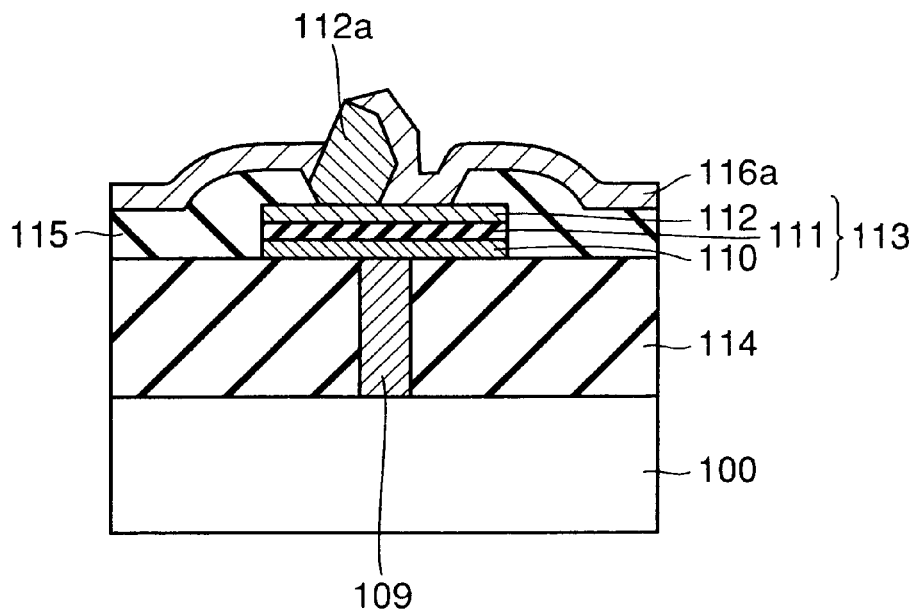
FIGS. 31 and 32 are sectional views for illustrating problems of conventional ferroelectric capacitor elements.
Figure 32:
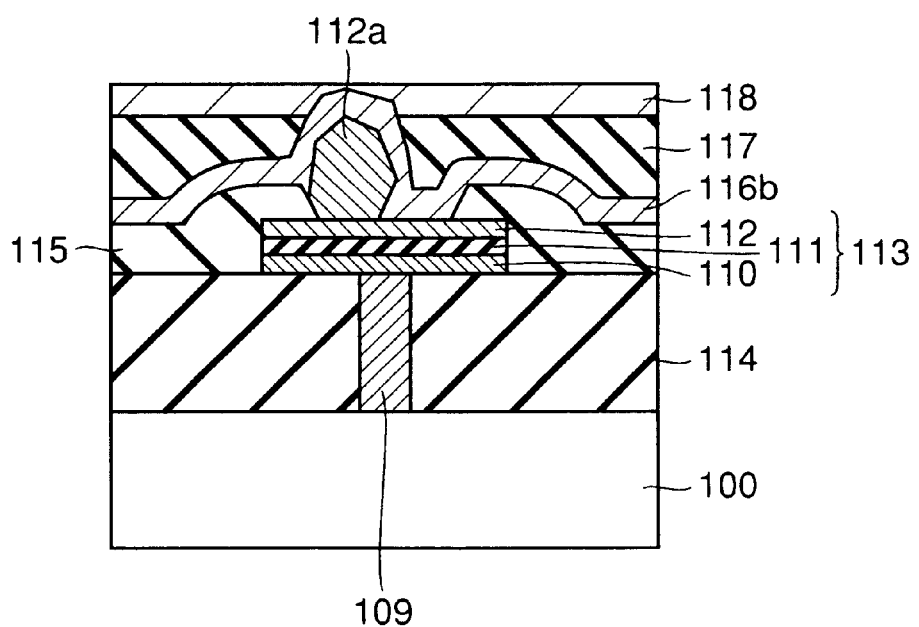

FIG. 25 is a microphotograph of the surface of the upper electrode subjected to oxygen annealing in the structure according to the fifth embodiment shown in FIG. 23 observed with an SEM, and FIG. 26 is a microphotograph of the surface of the upper electrode subjected to oxygen annealing in the comparative structure shown in FIG. 24 observed with an SEM. It is understood that no hillock (projection) is formed when employing the IrSiN film 8 according to the fifth embodiment as the upper electrode, as shown in FIG. 25. On the other hand, it is understood that hillocks (projections) having heights of about 1 $\mu$m at the maximum grow when employing the comparative Ir film 208 as the upper electrode, as shown in FIG. 26. Even when forming an interlayer isolation film in a thickness of about 500 nm, for example, in a later step, therefore, it is difficult to cover up such hillocks. In this case, disconnection of wires or short-circuiting across the wires is inconveniently caused as described with reference to FIGS. 31 and 32.

Figure 27:
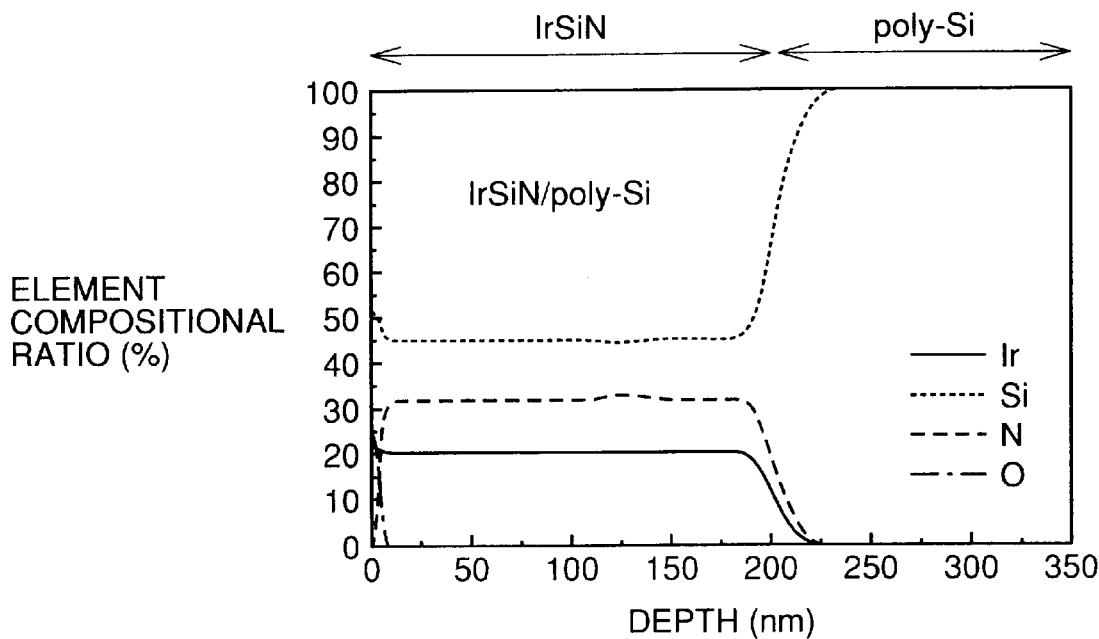
FIG. 27 is a diagram for illustrating the characteristics of the upper electrode according to the fifth embodiment shown in FIG. 23.
Figure 28:
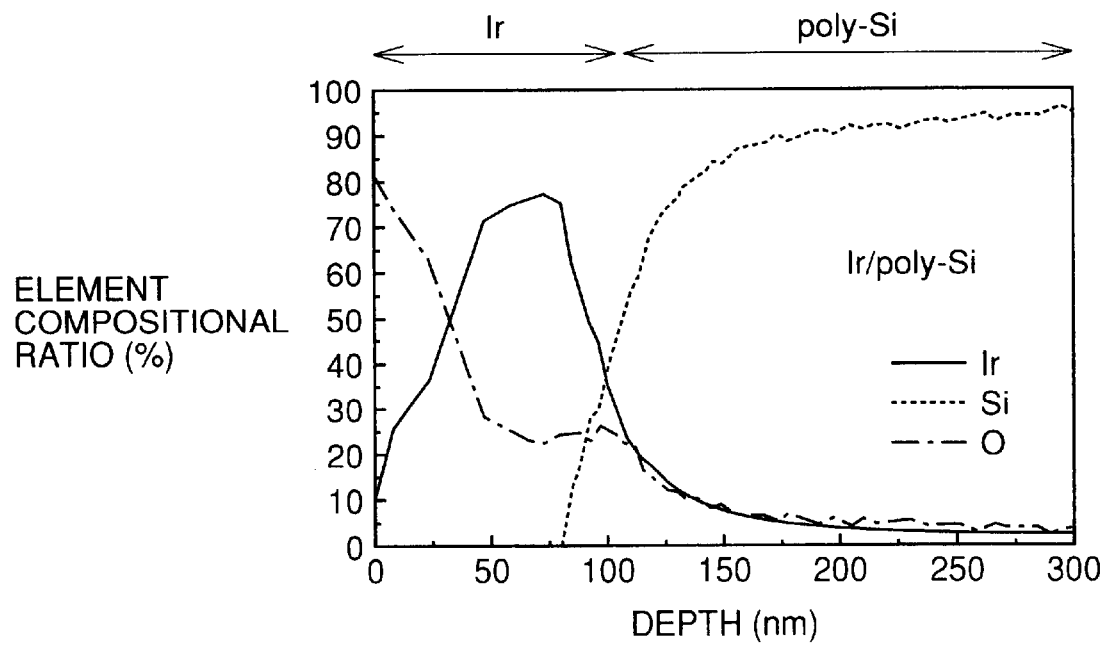
FIG. 28 is a diagram for illustrating the characteristics of the comparative upper electrode shown in FIG. 24.
Figure 29:
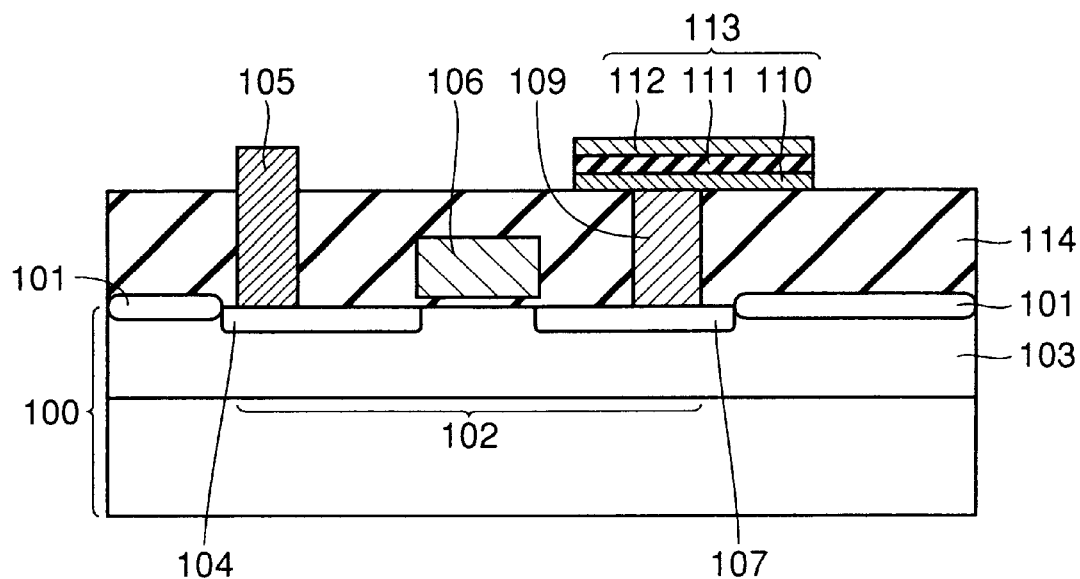
FIG. 29 is a sectional view showing the structure of a conventional ferroelectric memory.
Figure 30:
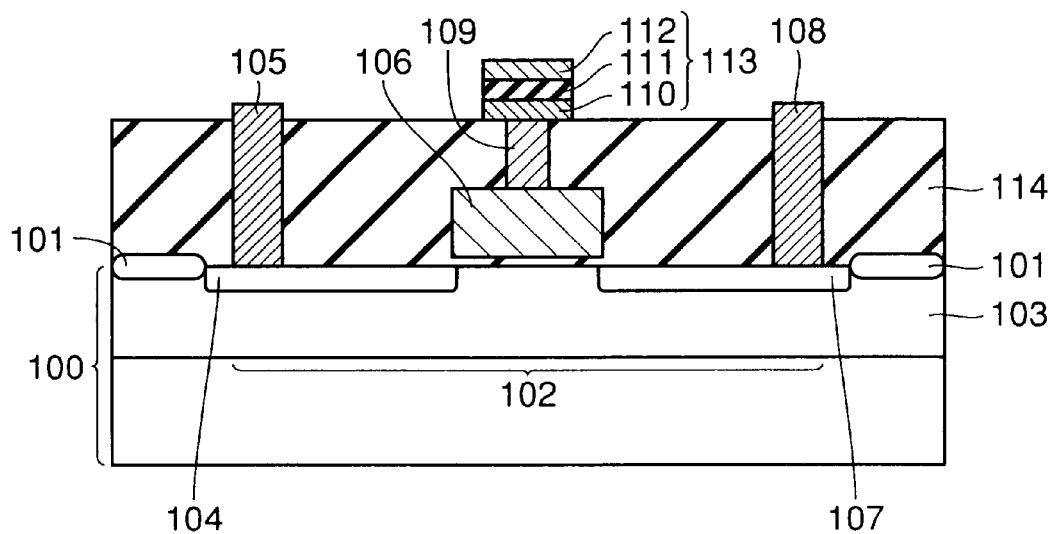
FIG. 30 is a sectional view showing the structure of another conventional ferroelectric memory.

FIG. 27 is a characteristic diagram showing results of element compositional ratios obtained by RBS with respect to an IrSiN (200 nm)/polycrystalline silicon (600 nm) film formed on a polycrystalline silicon film under the same conditions as the upper electrode according to the fifth embodiment shown in FIG. 23 after performing annealing in an oxygen atmosphere at 800° C. for 40 minutes. FIG. 28 is a characteristic diagram showing results of element compositional ratios obtained by RBS with respect to an Ir (100 nm)/polycrystalline silicon (600 nm) film formed on a polycrystalline silicon film under the same conditions as the comparative upper electrode shown in FIG. 24 after performing annealing in an oxygen atmosphere at 800° C. for 40 minutes.

It is understood from FIG. 27 that oxygen hardly diffuses into the IrSiN film 8 according to the fifth embodiment and the IrSiN film 8 is not oxidized. On the other hand, it is understood from FIG. 28 that the comparative Ir film 208 entirely contains oxygen and is oxidized. Thus, it is conceivable that the hillocks (projections) formed in the comparative sample shown in FIG. 26 are oxides of Ir.

Therefore, formation of hillocks (projections) can be effectively suppressed by forming the IrSiN film 8 which is a hardly oxidized conductive layer as the upper electrode in the fifth embodiment. Thus, the problem such as disconnection of wires or short-circuiting across the wires resulting from hillocks can be solved.

Table 1 shows values of film stress of the IrSiN film 8 employed in the fifth embodiment shown in FIG. 23 and the Ir film 208 employed in the comparative sample shown in FIG. 24 before and after oxygen annealing.

TABLE 1

| | Film Stress Before and After Annealing (unit:Pa) | |
|---|---|---|
| | Before Annealing | After Annealing |
| IrSiN | $4.94 \times 10^8$ | $4.29 \times 10^8$ |
| Ir | $3.8 \times 10^9$ | $6.1 \times 10^7$ |

Referring to Table 1, oxygen annealing is performed at 800° C. for 40 minutes. All values in Table 1 show compressive stress. Referring to Table 1, it is understood that stress change is not much caused before and after oxygen annealing in the IrSiN film 8 according to the fifth embodiment. It is also understood that large stress change is caused before and after oxygen annealing in the Ir film 208 according to the comparative sample. This is conceivably because the composition of the Ir film 208 changes following oxidation of Ir to remarkably change the stress along with formation of the hillocks.

It is known that the characteristics of a ferroelectric film vary with stress. This is disclosed in a report by Y. Kumagai et al. (Extended Abstracts of the 1999 International Conference on Sold State Device and Materials, pp. 388–389), for example. This literature reports that the remanent polarization value Pr and the saturation polarization value Ps of PZT vary with stress. Therefore, compositional change resulting from oxidation of an upper electrode and following stress change can be suppressed by forming a hardly oxidized conductive layer (the IrSiN film 8) on the surface of the upper electrode as in the present invention. Thus, stable ferroelectric characteristics can be attained thereby improving homogeneity of the characteristics of a capacitor element.

Although the present invention has been described and illustrated in detail, it is clearly understood that the same is by way of illustration and example only and is not to be taken by way of limitation, the spirit and scope of the present invention being limited only by the terms of the appended claims.

(1) While the IrSi film 12 or the IrSiN film 13, 25, 28, 50 or 53 is employed as the barrier film for stopping diffusion of oxygen in each of the first to third embodiments, for example, the present invention is not restricted to this but effects similar to those of the first to third embodiments can be attained also by employing a film obtained by adding tungsten (W), tantalum (Ta), ruthenium (Ru), rhodium (Rh) or titanium (Ti) to an IrSi film or an IrSiN film.

(2) While each of the first to fifth embodiments has been described with reference to the ferroelectric SBT film 7, 15, 27, 52 or 77 serving as an oxide-based dielectric film, the present invention is not restricted to this but another oxide-based ferroelectric film such as a PZT film, for example, may be employed.

(3) While each of the first to fifth embodiments has been described with reference to the ferroelectric capacitor element, the present invention is not restricted to this but a capacitor element employing an oxide-based paraelectric substance having a high dielectric constant is also employable. In other words, an oxide-based paraelectric film of BST, for example, having a high dielectric constant may be employed in place of the ferroelectric SBT film 7, 15, 27, 52 or 77.

(4) While each of the second, third and fourth embodiments employs the poly-Si film 24, 49 or 74 as the plug material located under the IrSiN film 25 or 50 or the PtSiN film 75, the present invention is not restricted to this but effects similar to those of the aforementioned second to fourth embodiments can be attained also when employing W.

(5) While the third embodiment employs the IrSiN film 50 or 53 as the barrier film for stopping diffusion of oxygen, the present invention is not restricted to this but an IrSi film or an IrSi/IrSiN multilayer film allowing reduction of resistance may be employed.

(6) While the third embodiment has been described with reference to the FET-type ferroelectric memory, the present invention is not restricted to this but similar effects can be attained also in a ferroelectric memory connecting a ferroelectric capacitor to a drain electrode through a plug.

(7) While the fourth embodiment employs Pt as the metal (M) forming (M)-Si—N, the present invention is not restricted to this but similar effects can be attained also when employing a material such as Ir, Ru or Re hardly forming a nitride in place of Pt. Further, similar effects can also be attained with a material forming a nitride but stabilized in a state of M×N ($x \geq 2$). For example, effects similar to those of the fourth embodiment can be attained also when employing Ni, Co or Mo as the metal (M) forming (M)-Si—N. Further, a plurality of such materials may be contained as the metal (M). For example, Pt-Ir may be employed as the metal (M).

(8) While the Pt film 76 is inserted as a conductive crystal film between the PtSiN barrier film 75 and the SBT film 77 of an oxide dielectric substance in the aforementioned fourth embodiment, the present invention is not restricted to this but similar effects can be attained with a metal film of Ir, Ru or Re or a metal film at least containing such a metal. For example, similar effects can be attained with Pt-Ir. Further, similar effects can be attained also when employing an oxide film of Ir, Ru or Re or a metal oxide film at least containing such a metal in place of the Pt film serving as a conductive crystal film. For example, $SrRuO_3$ or the like is conceivable.

(9) The present invention is applicable not only to a capacitor element but also to all elements employing dielectric substances.

(10) While the fifth embodiment employs the IrSiN film 8 as the hardly oxidized conductive layer forming the upper electrode, the present invention is not restricted to this but similar effects can be attained also when employing IrSi, TaN or TaSiN in place of IrSiN. Further, oxidation of the upper electrode can be effectively suppressed also when employing an upper electrode containing a metal including at least one metal selected from a group consisting of Ir, Pt, Ru, Re, Ni, Ta, Co and Mo and silicon.

(11) While the fifth embodiment employs the IrSiN film 8 as the upper electrode, the present invention is not restricted to this but a multilayer film of IrSiN/Ir or the like may be employed as the upper electrode. In this case, the uppermost layer of the IrSiN film can stop diffusion of oxygen. Thus, the Ir film is not oxidized. Further, the Ir film can reduce the resistance of the upper electrode. In this case, the IrSiN film corresponds to the "first conductor film" of the present invention, and the Ir film corresponds to the "second conductor film" of the present invention.

What is claimed is:

1. A dielectric element film comprising:
   an insulator film including an oxide-based dielectric film; and
   an electrode including a first conductor film containing at least one selected from the group consisting of NiSiN, CoSiN and MoSiN.

2. A dielectric element comprising:
   an insulator film including an oxide-based dielectric film; and
   an electrode including a first conductor film containing at least Ir and silicon, wherein
     said first conductor film is formed by a multilayer structure of a conductor film containing Ir and silicon and a conductor film containing Ir, silicon and nitrogen.

3. The dielectric element according to claim 2, wherein said conductor film containing Ir, silicon and nitrogen is arranged between said oxide-based dielectric film and said conductor film containing Ir and silicon.

4. A dielectric element comprising:
   an insulator film including an oxide-based dielectric film; and
   an electrode including a first conductor film consisting of Ir and silicon, further comprising a conductive crystal film arranged between said first conductor film and said insulator film.

5. The dielectric element according to claim 4 wherein said conductive crystal film is a metal film containing at least one metal selected from a group consisting of Pt, Ir, Ru and Re.

6. The dielectric element according to claim 4, wherein said conductive crystal film is a metal oxide film containing at least one metal selected from a group consisting of Pt, Ir, Ru and Re.

7. A dielectric element comprising:
   an insulator film including an oxide-based dielectric film; and
   an electrode including a first conductor film consisting of Ir and silicon, wherein
     said electrode including said first conductor film is an upper electrode, wherein
       said upper electrode includes a plurality of layers, and
       at least the uppermost layer of said upper electrode is formed by said first conductor film.

8. A dielectric element, comprising:
   an insulator film including an oxide-based dielectric film; and
   an electrode including a first conductor film comprising Ir and silicon, wherein
     said electrode including said first conductor film is an upper electrode, wherein
       said upper electrode includes a plurality of layers, and
       at least the uppermost layer of said upper electrode is formed by said first conductor film, and wherein
         said upper electrode is formed by a multilayer structure of said first conductor film, containing Ir, silicon and nitrogen, forming said uppermost layer and a second conductor film containing Ir.

9. The dielectric element according to claim 1, wherein said first conductor film is arranged between a conductive material and said insulator film.

10. The dielectric element according to claim 9, wherein said conductive material is converted to an insulating material when oxidized, and said first conductor film and said insulator film are successively formed on said conductive material.

11. The dielectric element according to claim 10, wherein said conductive material includes either a polycrystalline silicon plug or a tungsten plug.

12. The dielectric element according to claim 1, further comprising a conductive crystal film arranged between said first conductor film and said insulator film.

13. The dielectric element according to claim 12, wherein said conductive crystal film is a metal film containing at least one metal selected from the group consisting of Pt, Ir, Ru and Re.

14. The dielectric element according to claim 12, wherein said conductive crystal film is a metal oxide film containing at least one metal selected from the group consisting of Pt, Ir, Ru and Re.

15. The dielectric element according to claim 1, wherein said electrode including said first conductor film is an upper electrode.

16. The dielectric element according to claim 15, wherein said upper electrode includes a plurality of layers, and at least the uppermost layer of said upper electrode is formed by said first conductor film.

* * * * *